(12) United States Patent
Myoung et al.

(10) Patent No.: US 12,302,726 B2
(45) Date of Patent: May 13, 2025

(54) MICROSTRUCTURE ARRAY AND METHOD OF MANUFACTURING THE SAME AND MICRO-LIGHT-EMITTING DIODE AND METHOD OF MANUFACTURING THE SAME AND DISPLAY DEVICE

(71) Applicant: YONSEI UNIVERSITY, UNIVERSITY—INDUSTRY FOUNDATION (UIF), Seoul (KR)

(72) Inventors: JaeMin Myoung, Goyang-si (KR); DoHoon Kim, Paju-si (KR); HeeJu An, Seoul (KR)

(73) Assignee: YONSEI UNIVERSITY, UNIVERSITY-INDUSTRY FOUNDATION (UIF), Seoul (KR)

( * ) Notice: Subject to any disclaimer, the term of this patent is extended or adjusted under 35 U.S.C. 154(b) by 459 days.

(21) Appl. No.: 17/732,629

(22) Filed: Apr. 29, 2022

(65) Prior Publication Data
US 2022/0376217 A1   Nov. 24, 2022

(30) Foreign Application Priority Data

May 24, 2021   (KR) ........................ 10-2021-0066437

(51) Int. Cl.
*H10K 71/00*   (2023.01)
*H10K 50/135*   (2023.01)
(Continued)

(52) U.S. Cl.
CPC .......... *H10K 59/35* (2023.02); *H10K 50/135* (2023.02); *H10K 71/00* (2023.02); *H10K 71/12* (2023.02);
(Continued)

(58) Field of Classification Search
None
See application file for complete search history.

(56) References Cited

U.S. PATENT DOCUMENTS

| 2014/0326988 | A1* | 11/2014 | Yamaguchi | H10K 50/854 257/40 |
| 2021/0336139 | A1* | 10/2021 | Duan | H10K 71/40 |
| 2022/0102660 | A1* | 3/2022 | Lee | H10K 50/115 |

FOREIGN PATENT DOCUMENTS

KR   101971240 B1   4/2019

OTHER PUBLICATIONS

Honglei Wang, et al., Nanoimprinted perovskite metasurface for enhanced photoluminescence, vol. 25, No. 24; Nov. 27, 2017; Optics Express A1162, 10 pp.
(Continued)

*Primary Examiner* — Bilkis Jahan
(74) *Attorney, Agent, or Firm* — CANTOR COLBURN LLP

(57) ABSTRACT

A method of manufacturing microstructure array, a microstructure array, a micro-light-emitting diode, and a method for manufacturing the same, and a display device. The method of manufacturing microstructure array includes: preparing a red light-emitting perovskite precursor solution, a green light-emitting perovskite precursor solution, and a blue light-emitting perovskite precursor solution; coating the red light-emitting perovskite precursor solution, the green light-emitting perovskite precursor solution, and the blue light-emitting perovskite precursor solution, on a substrate having partitioned first, second, and third regions to form a red light-emitting perovskite precursor film, a green light-emitting perovskite precursor film, and a blue light-emitting perovskite precursor film, respectively; disposing a mold having a plurality of concave micropatterns on the red light-emitting perovskite precursor film, the green light-emitting perovskite precursor film, and the blue light-emitting perovskite precursor film, respectively; heat-treating the red light-emitting perovskite precursor film, the green light-emitting perovskite precursor film, and the blue light-emit-
(Continued)

ting perovskite precursor film in a plurality of concave micropatterns to obtain each of red light-emitting perovskite nanocrystals, green light-emitting perovskite nanocrystals, and blue light-emitting perovskite nanocrystals, and removing the mold to form a microstructure array.

13 Claims, 18 Drawing Sheets

(51) Int. Cl.
H10K 59/35 (2023.01)
H10K 71/12 (2023.01)
H10K 71/40 (2023.01)
H10K 85/50 (2023.01)
H10K 102/00 (2023.01)

(52) U.S. Cl.
CPC ............ *H10K 71/40* (2023.02); *H10K 85/50* (2023.02); *H10K 71/821* (2023.02); *H10K 2102/351* (2023.02); *H10K 2102/361* (2023.02)

(56) References Cited

OTHER PUBLICATIONS

Jingshan S. Du, et al., Halide perovskite nanocrystal arrays: Multiplexedsynthesis and size-dependent emission, Sci. Adv. 2020; 6; Sep. 23, 2020, 9 pp.
Sy Piecco, et al., Reusable Chemically-Micropatterned Substrates via SequentialPhotoinitiated Thiol-Ene Reactions as Template for Perovskite Thin-Film Microarrays, 2019, doi.org/10.26434/chemrxiv.8966297.v2, 40 pp.
Weicai Liu, et al., Patterned Lead Halide Perovskite Crystals Fabricated byMicrostructured Templates, American Chemical Society, Cryst. Growth Des. 2020, 20, 2803-2816.

* cited by examiner

MICROSTRUCTURE ARRAY AND METHOD OF MANUFACTURING THE SAME AND MICRO-LIGHT-EMITTING DIODE AND METHOD OF MANUFACTURING THE SAME AND DISPLAY DEVICE

CROSS-REFERENCE TO RELATED APPLICATION

This application claims priority to Korean Patent Application No. 10-2021-0066437 filed in the Korean Intellectual Property Office on May 24, 2021, and all the benefits accruing therefrom under 35 U.S.C. § 119, the content of which in its entirety is incorporated herein by reference.

BACKGROUND OF THE INVENTION

(a) Field of the Invention

A microstructure array and a method of manufacturing the same, a micro-light-emitting diode and a method of manufacturing the same, and a display device are disclosed.

(b) Description of the Related Art

Recently, according to a trend toward lighter weight and thinner thickness of a display device, research on light emitting devices using self-light emitters such as organic light emitting diodes or quantum dot light emitting diodes has been conducted.

Perovskite is one of the self-light emitters configured to emit light on its own, and is attracting attention as a key material for next-generation light emitting devices based on high color purity and good light-emitting characteristics.

SUMMARY OF THE INVENTION

An embodiment provides a microstructure array capable of exhibiting improved performance in a simple process.

Another embodiment provides a method of manufacturing the microstructure array.

Another embodiment provides a micro-light-emitting diode including the microstructure array.

Another embodiment provides a method of manufacturing the micro-light-emitting diode.

Another embodiment provides a display device including the microstructure array or the micro-light-emitting diode.

According to an embodiment, a method of manufacturing a microstructure array includes: preparing a red light-emitting perovskite precursor solution, a green light-emitting perovskite precursor solution, and a blue light-emitting perovskite precursor solution, respectively; coating the red light-emitting perovskite precursor solution, the green light-emitting perovskite precursor solution, and the blue light-emitting perovskite precursor solution, respectively on a substrate having partitioned first, second, and third regions to form a red light-emitting perovskite precursor film, a green light-emitting perovskite precursor film, and a blue light-emitting perovskite precursor film; disposing a mold having a plurality of concave micro-patterns on the red light-emitting perovskite precursor film, the green light-emitting perovskite precursor film, and the blue light-emitting perovskite precursor film, respectively; heat-treating the red light-emitting perovskite precursor film, the green light-emitting perovskite precursor film, and the blue light-emitting perovskite precursor film in the plurality of concave micro-patterns to obtain each of red light-emitting perovskite nanocrystals, green light-emitting perovskite nanocrystals, and blue light-emitting perovskite nanocrystals; and removing the mold to form a microstructure array in which a plurality of red light-emitting microstructures including the red light-emitting perovskite nanocrystals, a plurality of green light-emitting microstructures including the green light-emitting perovskite nanocrystals, and a plurality of blue light-emitting microstructures including the blue light-emitting perovskite nanocrystals are arranged.

The forming of the red light-emitting perovskite precursor film, the green light-emitting perovskite precursor film, and the blue light-emitting perovskite precursor film may include spin-coating the red light-emitting perovskite precursor solution, the green light-emitting perovskite precursor solution, and the blue light-emitting perovskite precursor solution.

The spin-coating of the red light-emitting perovskite precursor solution, the green light-emitting perovskite precursor solution, and the blue light-emitting perovskite precursor solution may be performed at a spin-coating rate at which a difference between an average thickness of the red light-emitting microstructures, the green light-emitting microstructures, and the blue light-emitting microstructure is minimized.

The difference between average thicknesses of the red light-emitting microstructures, the green light-emitting microstructures, and the blue light-emitting microstructures may be less than or equal to about 0.1 μm.

Each average thickness of the red light-emitting microstructures, the green light-emitting microstructures, and the blue light-emitting microstructures may be less than or equal to about 1 μm.

The spin-coating of the red light-emitting perovskite precursor solution, the green light-emitting perovskite precursor solution, and the blue light-emitting perovskite precursor solution may be performed at each spin-coating rate of about 3000 rpm to about 4000 rpm.

Each average crystal dimension of the red light-emitting perovskite nanocrystals, the green light-emitting perovskite nanocrystals, and the blue light-emitting perovskite nanocrystals may be less than or equal to about 200 nm.

Each of the red light-emitting perovskite precursor solution, the green light-emitting perovskite precursor solution, and the blue light-emitting perovskite precursor solution may include a perovskite precursor and a hydrophilic polymer.

The hydrophilic polymer may include polyethylene oxide, polyvinylpyrrolidone, polyethyleneimine, polyacrylamide, poly(meth)acrylate, polyvinyl alcohol, polyethylene glycol, polyoxazoline, a derivative thereof, or a copolymer thereof.

The red light-emitting perovskite precursor solution, the green light-emitting perovskite precursor solution, and the blue light-emitting perovskite precursor solution may each further include a ligand.

The ligand may be represented by RCOOH, RNH$_2$, R$_2$NH, R$_3$N, RN$_3$, RSH, RH$_2$PO, R$_2$HPO, R$_3$PO, RH$_2$P, R$_2$HP, R$_3$P, RN$_3$O$_3$P, ROH, RCOOR, RPO(OH)$_2$, RPOOH, RHPOOH, or R$_2$POOH, wherein each R is independently a substituted or unsubstituted C1 to C40 aliphatic hydrocarbon, a substituted or unsubstituted C6 to C40 aromatic hydrocarbon, or a combination thereof.

The heat-treating may be performed at a temperature of about 50° C. to about 200° C.

According to another embodiment, a method of manufacturing a micro-light-emitting diode includes forming a first electrode, forming a microstructure array on the first electrode, and forming a second electrode on the microstructure array, wherein the forming of the microstructure array is performed by the above method.

According to another embodiment, a microstructure array includes red light-emitting microstructures including red light-emitting perovskite nanocrystals, green light-emitting microstructures including green light-emitting perovskite nanocrystals, and blue light-emitting microstructures including blue light-emitting perovskite nanocrystals, wherein a difference between average thicknesses of the red light-emitting microstructures, the green light-emitting microstructures, and the blue light-emitting microstructures is less than or equal to about 0.1 µm.

Each average thickness of the red light-emitting microstructures, the green light-emitting microstructures, and the blue light-emitting microstructures may be less than or equal to about 1 µm.

An average size difference between the red light-emitting perovskite nanocrystals, the green light-emitting perovskite nanocrystals, and the blue light-emitting perovskite nanocrystals may be less than or equal to about 50 nm.

Each average size of the red light-emitting perovskite nanocrystals, the green light-emitting perovskite nanocrystals, and the blue light-emitting perovskite nanocrystals may be less than or equal to about 200 nm.

Each of the red light-emitting microstructures, the green light-emitting microstructures, and the blue light-emitting microstructures may further include a hydrophilic polymer.

The hydrophilic polymer may include polyethylene oxide, polyvinylpyrrolidone, polyethyleneimine, polyacrylamide, poly(meth)acrylate, polyvinyl alcohol, polyethylene glycol, polyoxazoline, a derivative thereof, or a copolymer thereof.

The red light-emitting microstructures, the green light-emitting microstructures, and the blue light-emitting microstructures may further include a ligand bound to surfaces of the red light-emitting perovskite nanocrystals, the green light-emitting perovskite nanocrystals, and the blue light-emitting perovskite nanocrystals.

The ligand may be represented by RCOOH, RNH$_2$, R$_2$NH, R$_3$N, RN$_3$, RSH, RH$_2$PO, R$_2$HPO, R$_3$PO, RH$_2$P, R$_2$HP, R$_3$P, RN$_3$O$_3$P, ROH, RCOOR, RPO(OH)$_2$, RPOOH, RHPOOH, or R$_2$POOH, wherein each R is independently a substituted or unsubstituted C1 to C40 aliphatic hydrocarbon, a substituted or unsubstituted C6 to C40 aromatic hydrocarbon, or a combination thereof.

According to another embodiment, a micro-light-emitting diode includes a first electrode and a second electrode facing each other, and the microstructure array disposed between the first electrode and the second electrode.

The micro-light-emitting diode may include a red subpixel configured to display red, a green subpixel configured to display green, and a blue subpixel configured to display blue, and the red subpixel may include the red light-emitting microstructures, the green subpixel may include the green light-emitting microstructures, and the blue subpixel may include the blue light-emitting microstructures.

According to another embodiment, a display device including the micro-light-emitting diode is provided.

A microstructure array and a micro-light-emitting diode capable of exhibiting improved performance through a simple process are provided.

DETAILED DESCRIPTION OF THE EMBODIMENTS

Figure 1:
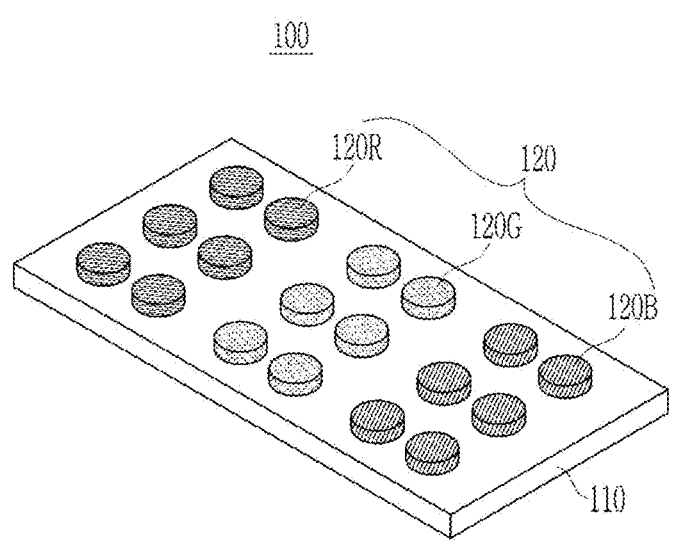
FIG. 1 is a schematic view showing an example of a microstructure array according to an embodiment.

Hereinafter, embodiments of the present disclosure will be described in detail so that a person skilled in the art would understand the same. This disclosure may, however, be embodied in many different forms and is not construed as limited to the example embodiments set forth herein.

In the drawings, the thicknesses of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when specific definition is not otherwise provided, "substituted" refers to replacement of a hydrogen of a compound by a substituent of a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

Hereinafter, the term "combination" includes a mixture and a stacked structure of two or more.

Hereinafter, a width and a length are dimensions extending in different directions (for example, a vertical direction) in the same plane, and a thickness, a depth, or a height is a dimension extending in each vertical direction with respect to the width and length. For example, in the case of a structure formed on a substrate, the dimensions extending in an in-plane direction (x and y directions) of the substrate may be a width and a length, respectively, and the dimensions extending in the thickness direction (z direction) of the substrate may be a thickness, a depth, or a height.

Hereinafter, a microstructure array according to an embodiment is described with reference to the drawings.

FIG. 1 is a schematic view showing an example of a microstructure array according to an embodiment.

Referring to FIG. 1, the microstructure array 100 according to an embodiment includes a substrate 110 and a plurality of microstructures 120 arranged randomly or in a predetermined direction on the substrate 110.

The plurality of microstructures 120 may be light-emitting microstructures configured to emit light of the same or different emission spectrum, and may include red light-emitting microstructures 120R configured to emit light of a red emission spectrum, green light-emitting microstructures 120G configured to emit light of a green emission spectrum, and blue light-emitting microstructures 120B configured to emit light of a blue emission spectrum. The emission spectrum of the red light-emitting microstructures 120R may have a maximum emission wavelength in the range of greater than about 600 nm and less than or equal to about 700 nm, the emission spectrum of the green light-emitting microstructures 120G may have a maximum emission wavelength in the range of about 500 nm to about 600 nm, and the emission spectrum of the blue light-emitting microstructures 120B may have a maximum emission wavelength in the range of greater than or equal to about 400 nm and less than about 500 nm.

The red light-emitting microstructures 120R, the green light-emitting microstructures 120G, and the blue light-emitting microstructures 120B may be arranged along rows and/or columns, respectively, but are not limited thereto.

The red light-emitting microstructures 120R, the green light-emitting microstructures 120G, and the blue light-emitting microstructures 120B each have an island-shaped light emitter having a dimension of submicrometers to several tens of micrometers and may have a polygonal such as a square, a rectangular, a hexagonal, or an octagonal shape, circular, or elliptical planar shape, but are not limited thereto. Herein, the dimension may be a width and/or a length. When the planar shapes of the microstructures 120 are circular or elliptical, the width and/or length may be a diameter or a longest diameter.

For example, the red light-emitting microstructures 120R, the green light-emitting microstructures 120G, and the blue light-emitting microstructures 120B may each have a flat plate shape. For example, the thickness of the red light-emitting microstructures 120R, the green light-emitting microstructures 120G, and the blue light-emitting microstructures 120B may be smaller than the width and length (or diameter) of the red light-emitting microstructures 120R, the green light-emitting microstructures 120G, and the blue light-emitting microstructures 120B.

For example, the width and length (diameter) of the red light-emitting microstructures 120R, the green light-emitting microstructures 120G, and the blue light-emitting microstructures 120B may be less than about 100 μm, respectively, within the above range, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 15 μm, less than or equal to about 10 μm, or less than or equal to about 7 μm, within the above range, greater than about 1 μm and less than or equal to about 80 μm, greater than about 1 μm and less than or equal to about 70 μm, greater than about 1 μm and less than or equal to about 60 μm, greater than about 1 μm and less than or equal to about 50 μm, greater than about 1 μm and less than or equal to about 40 μm, greater than about 1 μm and less than or equal to about 30 μm, greater than about 1 μm and less than or equal to about 20 μm, greater than about 1 μm and less than or equal to about 15 μm, greater than about 1 μm and less than or equal to about 10 μm, greater than about 1 μm and less than or equal to about 7 μm, about 3 μm to about 80 μm, about 3 μm to about 70 μm, about 3 μm to about 60 μm, about 3 μm to about 50 μm, about 3 μm to about 40 μm, about 3 μm to about 30 μm, about 3 μm to about 20 μm, about 3 μm to about 15 μm, about 3 μm to about 10 μm, or about 3 μm to about 7 μm.

For example, the thickness (e.g., average thickness) of the red light-emitting microstructures 120R, the green light-emitting microstructures 120G, and the blue light-emitting microstructures 120B may be less than or equal to about 1 μm, respectively, within the above range, less than or equal to about 0.9 μm, less than or equal to about 0.8 μm, less than or equal to about 0.7 μm, less than or equal to about 0.6 μm, or less than or equal to about 0.5 μm, about 0.01 μm to about 1 μm, about 0.01 μm to about 0.9 μm, about 0.01 μm to about 0.8 μm, about 0.01 μm to about 0.7 μm, about 0.01 μm to about 0.6 μm, about 0.01 μm to about 0.5 μm, about 0.05 μm to about 1 μm, about 0.05 μm to about 0.9 μm, about 0.05 μm to about 0.8 μm, about 0.05 μm to about 0.7 μm, about 0.05 μm to about 0.6 μm, about 0.05 μm to about 0.5 μm, about 0.1 μm to about 1 μm, about 0.1 μm to about 0.9 μm, about 0.1 μm to about 0.8 μm, about 0.1 μm to about 0.7 μm, about 0.1 μm to about 0.6 μm, or about 0.1 μm to about 0.5 μm.

For example, the red light-emitting microstructures 120R, the green light-emitting microstructures 120G, and the blue light-emitting microstructures 120B may each be a plate-shaped light emitter having a width and length (diameter) of about 3 μm to about 80 μm and a thickness of about 0.01 μm to about 1 μm, respectively. For example, the red light-emitting microstructures 120R, the green light-emitting microstructures 120G, and the blue light-emitting microstructures 120B may each be a plate-shaped light emitter having a width and length (diameter) of about 3 μm to about 50 μm and a thickness of about 0.01 μm to about 1 μm. For example, the red light-emitting microstructures 120R, the green light-emitting microstructures 120G, and the blue light-emitting microstructures 120B may each be a plate-shaped light emitter having a width and length (diameter) of about 3 μm to about 30 μm and a thickness of about 0.01 μm to about 1 μm. For example, the red light-emitting microstructures 120R, the green light-emitting microstructures 120G, and the blue light-emitting microstructures 120B may each be a plate-shaped light emitter having a width and length (diameter) of about 3 μm to about 20 μm and a thickness of about 0.01 μm to about 1 μm. For example, the red light-emitting microstructures 120R, the green light-emitting microstructures 120G, and the blue light-emitting microstructures 120B may each be a plate-shaped light emitter having a width and length (diameter) of about 3 μm to about 10 μm and a thickness of about 0.01 μm to about 1 μm.

For example, there may be no or a very small thickness difference between thicknesses of the red light-emitting microstructures 120R, the green light-emitting microstructures 120G, and the blue light-emitting microstructures 120B. Accordingly, uniformity of light emitted from the red light-emitting microstructures 120R, the green light-emitting microstructures 120G, and the blue light-emitting microstructures 120B may be increased and good light emitting characteristics may be exhibited.

For example, the difference between the average thicknesses of the red light-emitting microstructures 120R, the green light-emitting microstructures 120G, and the blue light-emitting microstructures 120B (for example, the difference between an average thickness between any two or three of the red light-emitting microstructures 120R, the green light-emitting microstructures 120G, and the blue light-emitting microstructures 120B) may be 30% or less, or within the above range about 25% or less, about 20% or less, about 15% or less, or about 10% or less of the average thickness of any one of the red light-emitting microstructures 120R, the green light-emitting microstructures 120G, and the blue light-emitting microstructures 120B.

For example, the difference between the average thicknesses of the red light-emitting microstructures 120R, the green light-emitting microstructures 120G, and the blue light-emitting microstructures 120B (for example, the difference between an average thickness between any two or three of the red light-emitting microstructures 120R, the green light-emitting microstructures 120G, and the blue light-emitting microstructures 120B) may be less than or equal to about 0.2 μm, for example 0 μm to about 0.2 μm, 0 μm to about 0.15 μm, 0 μm to about 0.1 μm, 0 μm to about 0.08 μm, 0 μm to about 0.05 μm, 0 μm to about 0.03 μm, 0 μm to about 0.02 μm, or 0 μm to about 0.01 μm. The thickness uniformity of the red light-emitting microstructures 120R, the green light-emitting microstructures 120G, and the blue light-emitting microstructures 120B may be implemented by controlling coating conditions of the precursor solution to be described later, for example, spin-coating rates of the precursor solutions. This will be described later.

The red light-emitting microstructures 120R, the green light-emitting microstructures 120G, and the blue light-emitting microstructures 120B may include perovskite nanocrystals and a hydrophilic polymer. That is, the red light-emitting microstructures 120R may include red light-emitting perovskite nanocrystals configured to emit light of a red emission spectrum by light or an electric field and a hydrophilic polymer, the green light-emitting microstructures 120G may include green light-emitting perovskite nanocrystals configured to emit light of a green emission spectrum by light or an electric field and a hydrophilic polymer, and the blue light-emitting microstructures 120B may include blue light-emitting perovskite nanocrystals configured to emit light of a blue emission spectrum by light or an electric field and a hydrophilic polymer.

The red light-emitting perovskite nanocrystals, the green light-emitting perovskite nanocrystals, and the blue light-emitting perovskite nanocrystals may have a crystal dimension of submicrometers. For example, the average crystal dimension of the red light-emitting perovskite nanocrystals, the green light-emitting perovskite nanocrystals, and the blue light-emitting perovskite nanocrystals may be less than or equal to about 800 nm, less than or equal to about 600 nm, less than or equal to about 500 nm, less than or equal to about 300 nm, less than or equal to about 200 nm, less than or equal to about 150 nm, less than or equal to about 100 nm, less than or equal to about 80 nm, or less than or equal to about 50 nm, or within the above range, about 2 nm to about 800 nm, about 2 nm to about 600 nm, about 2 nm to about 500 nm, about 2 nm to about 300 nm, about 2 nm to about 200 nm, about 2 nm to about 150 nm, about 2 nm to about 100 nm, about 2 nm to about 80 nm, or about 2 nm to about 50 nm. As such, defects in the crystal may be effectively reduced due to the crystal dimension of the submicrometer to prevent a decrease in luminous efficiency at room temperature.

The crystal dimensions (e.g., average crystal dimensions) of the red light-emitting perovskite nanocrystals, the green light-emitting perovskite nanocrystals, and the blue light-emitting perovskite nanocrystals may be relatively uniform. For example, the difference between crystal dimensions of the red light-emitting perovskite nanocrystals, the green light-emitting perovskite nanocrystals, and the blue light-emitting perovskite nanocrystals (for example, the difference between nanocrystal dimensions of any two or three of the red light-emitting perovskite nanocrystals, the green light-emitting perovskite nanocrystals, and the blue light-emitting perovskite nanocrystals) may be less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, or less than or equal to about 10 nm.

The crystal dimensions of the red light-emitting perovskite nanocrystals, the green light-emitting perovskite nanocrystals, and the blue light-emitting perovskite nanocrystals in the red light-emitting microstructures 120R, the green light-emitting microstructures 120G, and the blue light-emitting microstructures 120B may be relatively uniform. For example, the size deviation of the red light-emitting perovskite nanocrystals, the size deviation of the green light-emitting perovskite nanocrystals, and the size deviation of the blue light-emitting perovskite nanocrystals may be about 50% or less, about 40% or less, about 30% or less, about 20% or less, or about 10% or less of the average crystal dimension of the red light-emitting perovskite nanocrystals, the green light-emitting perovskite nanocrystals, and the blue light-emitting perovskite nanocrystals, respectively.

The red light-emitting perovskite nanocrystals, the green light-emitting perovskite nanocrystals, and the blue light-emitting perovskite nanocrystals may each have a crystal structure including a cation and an anion, for example, a layered structure or a non-layered structure. The red light-emitting perovskite nanocrystals, the green light-emitting perovskite nanocrystals, and the blue light-emitting perovskite nanocrystals may have a crystal structure represented by, for example, $ABX_3$, $A_2BX_4$, $ABX_4$, $A_{n-1}B_nX_{3n+1}$, or $L_2A_{n-1}B_nX_{3n+1}$ (0<n≤1), but are not limited thereto. Herein, A may be a monovalent inorganic cation such as $Li^+$, $Na^+$, $K^+$, $Rb^+$, and $Cs^+$, a monovalent organic cation such as an organic ammonium cation and an organic amino cation; or a combination thereof, and B may be a metal cation including a transition metal such as $Pb^{2+}$, $Sn^{2+}$, $Ge^{2+}$, $Ga^{2+}$, $In^{2+}$, $Al^{2+}$, $Sb^{2+}$, $Bi^{2+}$, and $Po^{2+}$, a rare earth metal, an alkaline earth metal, or a combination thereof, X may be an oxygen ion or a halide anion such as $F^-$, $Cl^-$, $Br^-$, or $I^-$, and L may be an aliphatic or aromatic ammonium cation or an aliphatic or aromatic amino cation which is different from A. The organic ammonium cation or organic amino cation may be, for example, methylammonium, formamidinium, or phenylammonium, but is not limited thereto. The aliphatic or aromatic ammonium cation or the aliphatic or aromatic amino cation may be, for example, n-butyl ammonium, 2-phenylmethyl ammonium, or 2-phenylethyl ammonium, but is not limited thereto.

For example, at least one of the red light-emitting perovskite nanocrystals, the green light-emitting perovskite nanocrystals, and the blue light-emitting perovskite nanocrystals may be halide perovskite nanocrystals including halide anions.

For example, at least one of the red light-emitting perovskite nanocrystals, the green light-emitting perovskite nanocrystals, and the blue light-emitting perovskite nanocrystals may be organic-inorganic hybrid perovskite nanocrystals including organic cations and metal cations.

For example, the red light-emitting perovskite nanocrystals, the green light-emitting perovskite nanocrystals, and the blue light-emitting perovskite nanocrystals may be $CH_3NH_3PbBr_3$, $CH_3NH_3PbI_3$, $CH_3NH_3SnBr_3$, $CH_3NH_3SnI_3$, $CH_3NH_3Sn_{1-x}Pb_xBr_3$, $CH_3NH_3Sn_{1-x}Pb_xI_3$, $HC(NH_2)_2PbI_3$, $HC(NH_2)_2SnI_3$, $(C_4H_9NH_3)_2PbBr_4$, $(C_6H_5CH_2NH_3)_2PbBr_4$, $(C_6H_5CH_2NH_3)_2PbI_4$, $(C_6H_5C_2H_4NH_3)_2PbBr_4$, $(C_6H_{13}NH_3)_2(CH_3NH_3)_{n-1}Pb_nI_{3n+1}$, or a combination thereof, but are not limited thereto.

A ligand may be bonded or coordinated to the surface of the red light-emitting perovskite nanocrystals, the green light-emitting perovskite nanocrystals, and the blue light-emitting perovskite nanocrystals. The ligand may be, for example, an organic ligand, and may be derived from, for example, aliphatic hydrocarbons and/or aromatic hydrocarbons. The ligand may be, for example, derived from $RCOOH$, $RNH_2$, $R_2NH$, $R_3N$, $RN_3$, $RSH$, $RH_2PO$, $R_2HPO$, $R_3PO$, $RH_2P$, $R_2HP$, $R_3P$, $RN_3O_3P$, $ROH$, $RCOOR$, $RPO(OH)_2$, $RPOOH$, $RHPOOH$, or $R_2POOH$, wherein each R is independently a substituted or unsubstituted C1 to C40 aliphatic hydrocarbon, a substituted or unsubstituted C6 to C40 aromatic hydrocarbon, or a combination thereof. The ligand may be, for example, derived from methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine, or oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; a substituted or unsubstituted phosphoryl azide (e.g., diphenylphosphorylazide (DPPA)); a phosphine oxide such as a substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphineoxide, etc.), a substituted or unsubstituted propyl phosphine oxide, a substituted or unsubstituted butyl phosphine oxide, a substituted or unsubstituted octylphosphine oxide (e.g., trioctylphosphineoxide (TOPO), and the like; a diphenyl phosphine, a triphenyl phosphine compound or an oxide compound thereof; a C2 to C40 phosphonic acid; a C2 to C40 phosphinic acid, and the like, but is not limited thereto.

The ligand may effectively control a crystal growth from the red perovskite precursor, green perovskite precursor, and/or blue perovskite precursor in the process of forming the microstructures 120, as described later, so that the red light-emitting perovskite nanocrystals, the green light-emitting perovskite nanocrystals, and the blue light-emitting perovskite nanocrystals may grow relatively uniformly to have a crystal dimension of the submicrometer.

The hydrophilic polymers included in each of the red light-emitting microstructures 120R, the green light-emitting microstructures 120G, and the blue light-emitting microstructures 120B may surround the red light-emitting perovskite nanocrystals, the green light-emitting perovskite nanocrystals, and the blue light-emitting perovskite nanocrystals in the red light-emitting microstructures 120R, the green light-emitting microstructures 120G, and the blue light-emitting microstructures 120B, and may be, for example, a chain-type or crosslinked polymer. The hydrophilic polymers included in the red light-emitting microstructures 120R, the green light-emitting microstructures 120G, and the blue light-emitting microstructures 120B may be the same as or different from each other.

In the forming of the microstructures 120 as described later, the hydrophilic polymers may reduce surface energy between a red light-emitting perovskite precursor solution, a green light-emitting perovskite precursor solution, or a blue light-emitting perovskite precursor solution and the substrate 110, and thus the wettability of the red light-emitting perovskite precursor solution, the green light-emitting perovskite precursor solution, and the blue light-emitting perovskite precursor solution to the substrate 110 may be increased, thereby forming microstructures of a desired shape and dimension according to the concave micro-pattern of the mold. In addition, the hydrophilic polymer may reduce exposure of the red light-emitting perovskite nanocrystals, the green light-emitting perovskite nanocrystals, and the blue light-emitting perovskite nanocrystals in the microstructures 120 to oxygen and/or moisture in the air, and thereby deterioration due to oxygen and/or moisture may be prevented.

The hydrophilic polymer may include, for example, polyethylene oxide (PEO), polyvinylpyrrolidone (PVP), polyethyleneimine (PEI), polyacrylamide (PAM), poly(meth)acrylate (PMA), polyvinylalcohol (PVA), polyethylene glycol (PEG), polyoxazoline (PEOXA), a derivative thereof, or a copolymer thereof, but is not limited thereto.

The hydrophilic polymer may be included, for example, at equal to or less than the red light-emitting perovskite nanocrystals, the green light-emitting perovskite nanocrystals, or the blue light-emitting perovskite nanocrystals. For example, the hydrophilic polymer may be included in an amount of about 0.1 to 100 parts by weight, or within the above range, about 1 to 80 parts by weight, about 1 to 50 parts by weight, about 1 to 30 parts by weight, or about 1 to 20 parts by weight based on 100 parts by weight of the red light-emitting perovskite nanocrystals, the green light-emitting perovskite nanocrystals, or the blue light-emitting perovskite nanocrystals.

Hereinafter, a method of manufacturing the microstructure array 100 according to an embodiment is described with reference to the drawings.

FIGS. 2, 3A to 3C, 4, 5, and 6A to 6C are schematic views showing examples of a method of manufacturing a microstructure array according to an embodiment.

Figure 2:
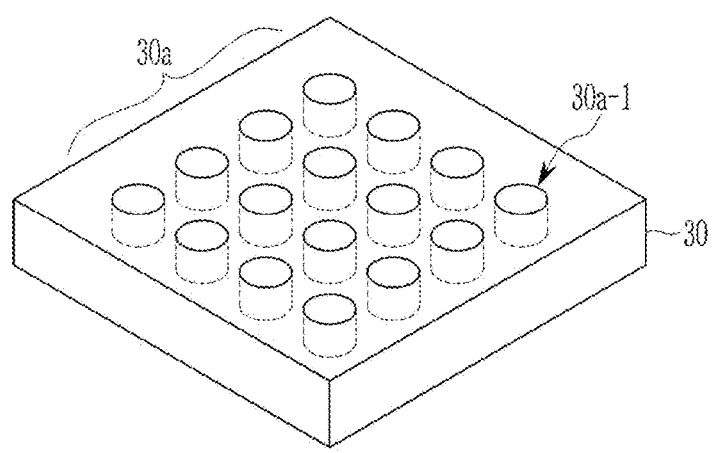
FIGS. 2, 3A, 3B, 3C, 4, 5, and 6A, 6B, and 6C, are schematic views showing examples of a method of manufacturing a microstructure array according to an embodiment.

First, referring to FIG. 2, a patterned mold 30 for forming the microstructure array 100 is prepared. The patterned mold 30 includes a concave micropattern array 30a in which a plurality of concave micropatterns 30a-1 are arranged in a predetermined direction or randomly arranged. The concave micropattern 30a-1 may have empty spaces therein, and the empty spaces may be regions in which the perovskite precursor solution, which will be described later, is confined and the microstructures 120 are formed.

The shape and dimension of the concave micropattern 30a-1 may be determined according to the microstructures 120 to be formed, for example, the shape and dimension of the concave micropattern 30a-1 may be designed to be substantially the same in shape and dimension of the microstructures 120 to be formed. For example, the planar shape of the concave micropattern 30a-1 may be a polygonal shape such as a square, rectangular, hexagonal, or octagonal shape, a circular shape, or an elliptical shape, but is not limited thereto. For example, the width and length (diameter) of the concave micropattern 30a-1 may be less than about 100 μm, and within the range, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 15 μm, less than or equal to about 10 μm, or less than or equal to about 7 μm, within the range, greater than about 1 μm and less than or equal to about 80 μm, greater than about 1 μm and less than or equal to about 70 μm, greater than about 1 μm and less than or equal to about 60 μm, greater than about 1 μm and less than or equal to about 50 μm, greater than about 1 μm and less than or equal to about 40 μm, greater than about 1 μm and less than or equal to about 30 μm, greater than about 1 μm and less than or equal to about 20 μm, greater than about 1 μm and less than or equal to about 15 μm, greater than about 1 μm and less than or equal to about 10 μm, or greater than about 1 μm and less than or equal to about 7 μm.

A depth of the concave micropattern 30a-1 may be shallower than a thickness of the mold 30. The depth of the concave micropattern 30a-1 may be, for example, about 0.1 to about 0.9 times, about 0.1 to about 0.7 times, or about 0.1 to about 0.5 times as deep as the thickness of the concave micropattern 30a-1, but is not limited thereto.

Figure 3A:
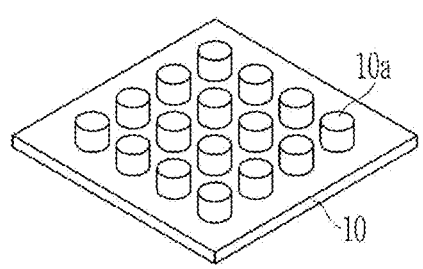
Figure 3B:
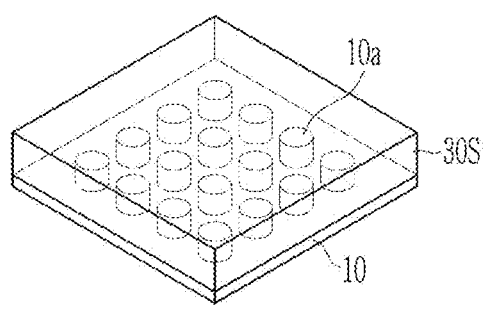
Figure 3C:
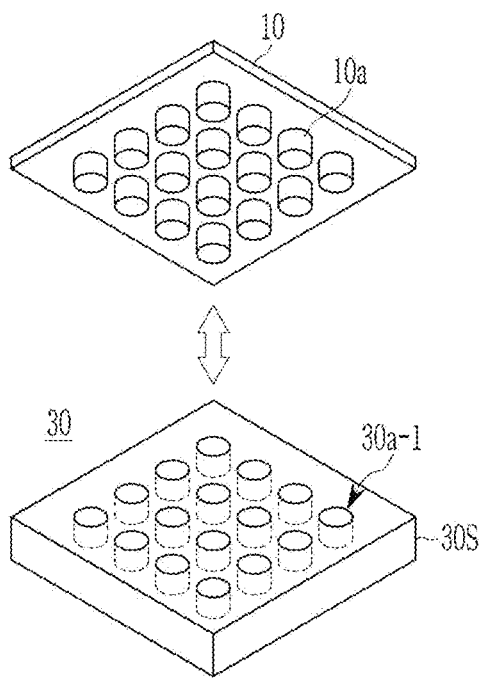

For example, the patterned mold 30 may be manufactured by using a photosensitive resin and an elastic polymer. For example, referring to FIG. 3A, the photosensitive resin is coated on the support substrate 10 and then performed a photolithography to form a convex pattern 10a having a predetermined shape and dimension. The convex pattern 10a may have a substantially equivalent shape and dimension to those of the concave micropattern 30a-1 except the concave/convex are reversed. Referring to FIG. 3B, an elastic polymer solution is coated on the support substrate 10 on which the convex patterns 10a are formed to form an elastic polymer film 30S. The elastic polymer solution may include an elastic polymer such as polydimethylsiloxane (PDMS) and a cross-linking agent. The cross-linking agent may be included in an amount of about 0.1 to 50 parts by weight based on 100 parts by weight of the elastic polymer. Subsequently, the elastic polymer film 30S is cured. The curing may be, for example, thermal curing and/or photo curing, and for example, the thermal curing may be performed at about 50° C. to about 200° C. for about 1 hour to about 10 hours. Referring to FIG. 3C, the cured elastic polymer film 30S are separated from the support substrate 10 to obtain the mold 30 having a plurality of the concave micropatterns 30a-1.

Next, a red light-emitting perovskite precursor solution, a green light-emitting perovskite precursor solution, and a blue light-emitting perovskite precursor solution are prepared. The red light-emitting perovskite precursor solution may include a red light-emitting perovskite precursor and a hydrophilic polymer, and optionally a ligand, the green light-emitting perovskite precursor solution may include a green light-emitting perovskite precursor and a hydrophilic polymer, and optionally a ligand, and the blue light-emitting perovskite precursor solution may include a blue light-emitting perovskite precursor and a hydrophilic polymer, and optionally a ligand.

The red light-emitting perovskite precursor, green light-emitting perovskite precursor, and blue light-emitting perovskite precursor may be prepared by mixing, for example, a cation and an anion in a solvent, respectively. At this time, the red light-emitting perovskite precursor solution, green light-emitting perovskite precursor solution, and blue light-emitting perovskite precursor solution may be prepared by separately preparing a cation solution in which a cation is dissolved or dispersed in a first solvent, and an anion solution in which an anion is dissolved or dispersed in a second solvent, respectively, and then mixing them, or may be prepared by mixing cations and anions in a solvent.

The cations may be supplied, for example, in the form of a compound capable of providing a monovalent inorganic cation such as $Li^+$, $Na^+$, $K^+$, $Rb^+$, and $Cs^+$, a monovalent organic cation such as an organic ammonium cation and an organic amino cation; or a combination thereof; a divalent metal cation including a transition metal such as $Pb^{2+}$, $Sn^{2+}$, $Ge^{2+}$, $Ga^{2+}$, $In^{2+}$, $Al^{2+}$, $Sb^{2+}$, $Bi^{2+}$, and $Po^{2+}$, a rare earth metal, an alkaline earth metal, or a combination thereof; or a combination thereof, and the anions may be supplied, for example, in the form of a compound capable of providing a halide anion. For example, the monovalent organic cation may be alkylammonium, arylammonium, arylalkylammonium, alkylamidinium, arylamidinium, arylalkylamidinium, or a combination thereof, for example, methylammonium, formamidinium, or phenylammonium, n-butylammonium, 2-phenylmethylammonium, or 2-phenylethylammonium, $CH_3NH_3$, $HC(NH_2)_2$, $C_4H_6NH_3$, $C_6H_5CH_2NH_3$, $C_6H_5C_2H_4NH_3$, $C_6H_{13}NH_3$, or a combination thereof, but is not limited thereto. The divalent metal cation may be, for example, $Pb^{2+}$ or $Sn^{2+}$, and the halide anion may be, for example, $F^-$, $Cl^-$, $Br^-$, or $I^-$.

The hydrophilic polymer may include, for example, polyethylene oxide, polyvinylpyrrolidone, polyethyleneimine, polyacrylamide, poly(meth)acrylate, polyvinyl alcohol, polyethylene glycol, polyoxazoline, a derivative thereof, or a copolymer thereof.

The ligand may include, for example, an aliphatic hydrocarbon and/or an aromatic hydrocarbon and may be, for example, derived from RCOOH, $RNH_2$, $R_2NH$, $R_3N$, $RN_3$, RSH, $RH_2PO$, $R_2HPO$, $R_3PO$, $RH_2P$, $R_2HP$, $R_3P$, $RN_3O_3P$, ROH, RCOOR, $RPO(OH)_2$, RPOOH, RHPOOH, or $R_2POOH$, wherein each R is independently a substituted or unsubstituted C1 to C40 aliphatic hydrocarbon, a substituted or unsubstituted C6 to C40 aromatic hydrocarbon, or a combination thereof. The ligand may be, for example, derived from methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine, oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; a substituted or unsubstituted phosphoryl azide (e.g., diphenylphosphorylazide (DPPA)); a phosphine oxide such as a substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO), and the like; a diphenyl phosphine, a triphenyl phosphine compound, or an oxide compound thereof; a C2 to C40 phosphonic acid; a C2 to C40 phosphinic acid, and the like, but is not limited thereto.

The solvent is not particularly limited as long as it may dissolve or disperse the aforementioned components. The solvent may be, for example, an organic solvent, for example, dimethylformamide, dimethylsulfoxide, or a combination thereof, but is not limited thereto.

The red light-emitting perovskite precursor, green light-emitting perovskite precursor, or blue light-emitting perovskite precursor may be included in each amount of about 5 wt % to about 50 wt % based on the total amount of the precursor solution. The hydrophilic polymer may be included in an amount of about 1 wt % to about 30 wt %, respectively, based on the total content of the precursor solution. The ligand may be included in an amount of about 0.001 wt % to about 10 wt %, respectively, based on the total content of the precursor solution. The solvent may be included in the remaining amount excluding the aforementioned components.

Figure 4:
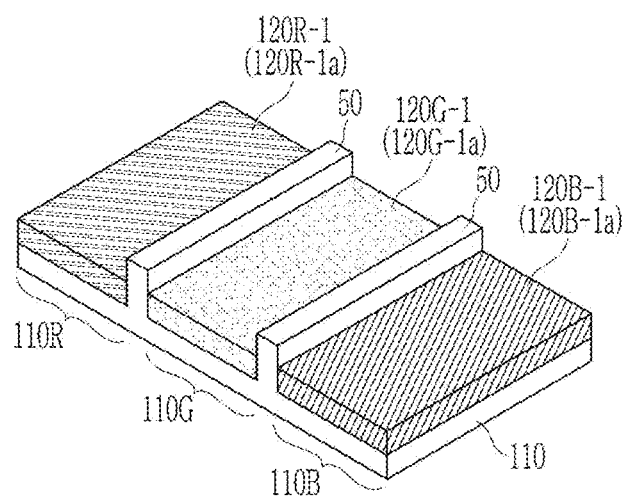

Next, referring to FIG. 4, the aforementioned red light-emitting perovskite precursor solution 120R-1a, the green light-emitting perovskite precursor solution 120G-1a, and the blue light-emitting perovskite precursor solution 120B-1a are coated on the substrate 110.

The substrate 110 includes a first region 110R, a second region 110G, and a third region 110B that are partitioned, and the first region 110R, the second region 110G, and the third region 110B may be separated by a partition wall 50. When the red light-emitting perovskite precursor solution 120R-1a, the green light-emitting perovskite precursor solution 120G-1a, or the blue light-emitting perovskite precursor solution 120B-1a is coated, the partition wall 50 may define the solutions into that area and prevent the solutions from overflowing or flowing into the adjacent area. The partition wall 50 may include, for example, an elastic polymer, for example, polydimethylsiloxane (PDMS), but is not limited thereto.

Then, in the first region 110R, the second region 110G, and the third region 110B of the partitioned substrate 110, the red light-emitting perovskite precursor solution 120R-1a, the green light-emitting perovskite precursor solution 120G-1a, and the blue light-emitting perovskite precursor solution 120B-1a are coated. The red light-emitting perovskite precursor solution 120R-1a, the green light-emitting perovskite precursor solution 120G-1a, or the blue light-emitting perovskite precursor solution 120B-1a may be coated by, for example, spin coating, and may be performed at the same or different spin-coating rates, respectively. The spin coating may facilitate evaporation of the solvent from the red light-emitting perovskite precursor solution 120R-1a, the green light-emitting perovskite precursor solution 120G-1a, or the blue light-emitting perovskite precursor solution 120B-1a and make the red light-emitting perovskite precursor, the green light-emitting perovskite precursor, or the blue light-emitting perovskite precursor have a uniform distribution.

Each spin-coating rate of the red light-emitting perovskite precursor solution 120R-1a, the green light-emitting perovskite precursor solution 120G-1a, or the blue light-emitting perovskite precursor solution 120B-1a may determine each thickness (average thickness) of the red light-emitting microstructures 120R, the green light-emitting microstructures 120G, and the blue light-emitting microstructures 120B, minimizing a thickness (average thickness) difference of the red light-emitting microstructures 120R, the green light-emitting microstructures 120G, and the blue light-emitting microstructures 120B.

For example, the spin-coating of the red light-emitting perovskite precursor solution 120R-1a, the green light-emitting perovskite precursor solution 120G-1a, and the blue light-emitting perovskite precursor solution 120B-1a may be performed to have a thickness (average thickness) difference of less than or equal to about 0.2 μm of the red light-emitting microstructures 120R, the green light-emitting microstructures 120G, and the blue light-emitting microstructures 120B, or within the above range, for example, 0 μm to about 0.2 μm, 0 μm to about 0.15 μm, 0 μm to about 0.1 μm, 0 μm to about 0.08 μm, 0 μm to about 0.05 μm, 0 μm to about 0.03 μm, 0 μm to about 0.02 μm, or 0 μm to about 0.01 μm.

For example, the red light-emitting perovskite precursor solution 120R-1a, the green light-emitting perovskite precursor solution 120G-1a, and the blue light-emitting perovskite precursor solution 120B-1a may be respectively coated at a spin-coating rate of about 1000 rpm to about 5000 rpm, and within the above range, about 2000 rpm to about 4000 rpm, or about 3000 rpm to about 4000 rpm. The spin coating may be performed for about 5 seconds to about 3 minutes, and within the above range, about 10 seconds to about 2 minutes.

The red light-emitting perovskite precursor solution 120R-1a, the green light-emitting perovskite precursor solution 120G-1a, and the blue light-emitting perovskite precursor solution 120B-1a coated by the spin-coating may be formed into a red light-emitting perovskite precursor film 120R-1, a green light-emitting perovskite precursor film 120G-1, and a blue light-emitting perovskite precursor film 120B-1 having a predetermined thickness within a first region 110R, a second region 110G, and a third region 110B of the substrate 110, respectively. The red light-emitting perovskite precursor film 120R-1, the green light-emitting perovskite precursor film 120G-1, and the blue light-emitting perovskite precursor film 120B-1 may be densely formed to have a substantially uniform thickness, for example, to have a surface in a flat gel state.

Figure 5:
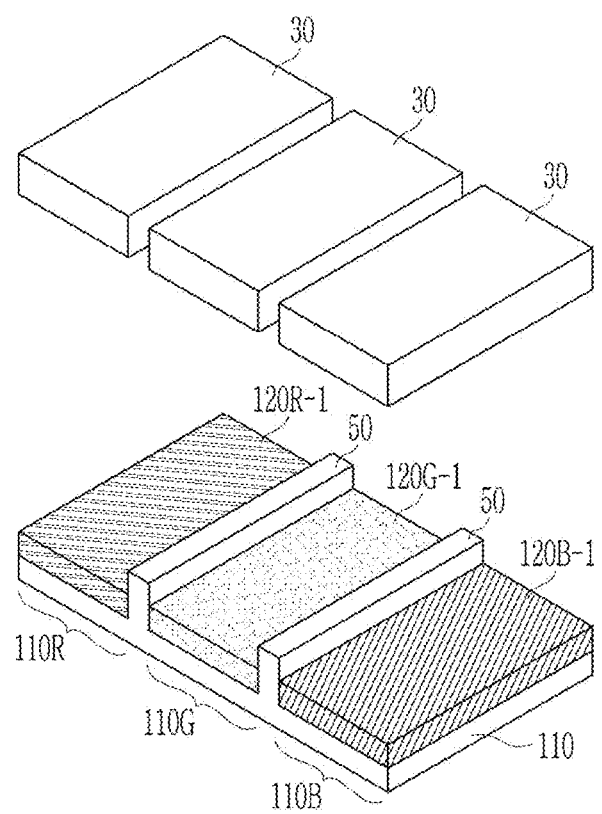

Referring to FIG. 5, the above patterned mold 30 is disposed over the red light-emitting perovskite precursor film 120R-1, the green light-emitting perovskite precursor film 120G-1, and the blue light-emitting perovskite precursor film 120B-1 coated in the first region 110R, the second region 110G, and the third region 1106 of the substrate 110 and then compressed. Accordingly, the coated red light-emitting perovskite precursor film 120R-1, green light-emitting perovskite precursor film 120G-1, and blue light-emitting perovskite precursor film 120B-1 may be confined within each concave micropattern 30a-1 of the patterned mold 30.

Subsequently, the substrate 110 may be heat-treated. The heat treatment may be performed, for example, at about 50° C. to about 200° C. for about 1 minute to about 10 hours, but is not limited thereto. The heat treatment temperature may be, within the above range, about 60° C. to about 180° C., about 70° C. to about 150° C., about 70° C. to about 120° C., or about 70° C. to about 100° C.

Figure 6A:
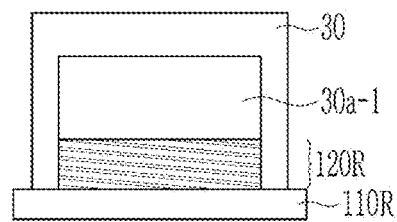
Figure 6B:
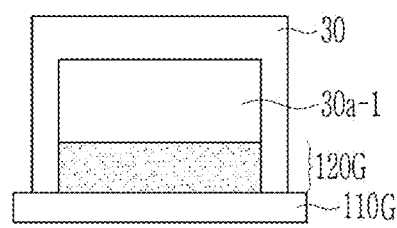
Figure 6C:
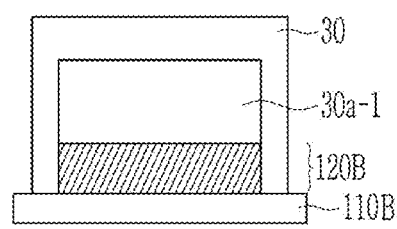

According to this heat treatment, as shown in FIGS. 6A to 6C, as the solvent is removed respectively from the red light-emitting perovskite precursor film 120R-1, the green light-emitting perovskite precursor film 120G-1, and the blue light-emitting perovskite precursor film 120B-1, the red light-emitting microstructures 120R including a composite of the red light-emitting perovskite nanocrystals grown from red light-emitting perovskite precursors, a hydrophilic polymer, and optionally, a ligand are formed on the first region 110R of the substrate 110, the green light-emitting microstructures 120G including a composite of the green light-emitting perovskite nanocrystals grown from green light-emitting perovskite precursors, a hydrophilic polymer, and optionally, a ligand on the second region 110G of the substrate 110, and the blue light-emitting microstructures 120B including a composite of the blue light-emitting perovskite nanocrystals grown form blue light-emitting perovskite precursors, a hydrophilic polymer, and optionally, a ligand is formed on the third region 1108 of the substrate 110.

Herein, as described above, since the solvent in the red light-emitting perovskite precursor film 120R-1, the green light-emitting perovskite precursor film 120G-1, and the blue light-emitting perovskite precursor film 120B-1 coated through the spin coating may be effectively controlled, and the red light-emitting perovskite precursors, the green light-emitting perovskite precursors, and the blue light-emitting perovskite precursors are uniformly distributed respectively in the red light-emitting perovskite precursor film 120R-1, the green light-emitting perovskite precursor film 120G-1, and the blue light-emitting perovskite precursor film (120B-1), the red light-emitting perovskite nanocrystals, the green light-emitting perovskite nanocrystals, and the blue light-emitting perovskite nanocrystals grown therefrom may have high uniformity.

Referring to FIG. 1, the mold 30 is removed from the substrate 110 to obtain the microstructure array 100 in which a plurality of the red light-emitting microstructures 120R, a plurality of the green light-emitting microstructures 120G, and a plurality of the blue light-emitting microstructures 120B are arranged. The red light-emitting microstructures 120R, the green light-emitting microstructures 120G, and the blue light-emitting microstructures 120B may have substantially the same size as the concave micropatterns 30a-1 of the mold 30 or a smaller size than the concave micropatterns 30a-1 due to shrinkage and the like through the heat treatment.

In this way, the microstructure array 100 according to the embodiment may use the mold 30 having the concave micropattern 30a-1 to effectively precipitate the red perovskite nanocrystals, green perovskite nanocrystals, and blue perovskite nanocrystals having submicrometer crystal dimensions by previously defining a predetermined region where the microstructures 120 will be formed (e.g., a subpixel region of a post-described micro-light-emitting diode), supplying this predetermined region with the red perovskite precursor solution, green perovskite precursor solution, and blue perovskite precursor solution, respectively, and crystallizing them. Accordingly, the perovskite crystallization and the micropattern formation are simultaneously performed in a simpler process than the conventional process of separately performing the perovskite crystallization and the micropattern.

In addition, this process may be performed under non-vacuum (e.g., the atmospheric pressure) and thus may need no separate equipment such as a vacuum equipment and resultantly reduce a process cost.

In addition, since this process is performed by using the perovskite precursor solution including the perovskite precursor, the hydrophilic polymer, and optionally the ligand in a confined space inside the concave micropattern 30a-1, the microstructures 120 having a desired shape and dimension as well as the submicrometer crystal dimension may be effectively formed due to a high substrate wettability effect of the hydrophilic polymer and a perovskite crystal growth-control effect of the ligand.

In addition, the red light-emitting perovskite precursor film 120R-1, the green light-emitting perovskite precursor film 120G-1, and the blue light-emitting perovskite precursor film 120B-1 are formed from the red light-emitting perovskite precursor solution 120R-1a, the green light-emitting perovskite precursor solution 120G-1a, and the blue light-emitting perovskite precursor solution 120B-1a, respectively, under predetermined spin-coating conditions (e.g., spin-coating rates for minimizing thickness (average thickness) differences of the red light-emitting microstructures 120R, the green light-emitting microstructures 120G, and the blue light-emitting microstructures 120B) to increase uniformity of the red light-emitting microstructures 120R, the green light-emitting microstructures 120G, and the blue light-emitting microstructures 120B and thus uniformly improve red, green, and blue light emission characteristics.

The microstructure array 100 may be coated as an active layer of a micro-light-emitting diode.

Hereinafter, a micro-light-emitting diode according to an embodiment is described.

Figure 7:
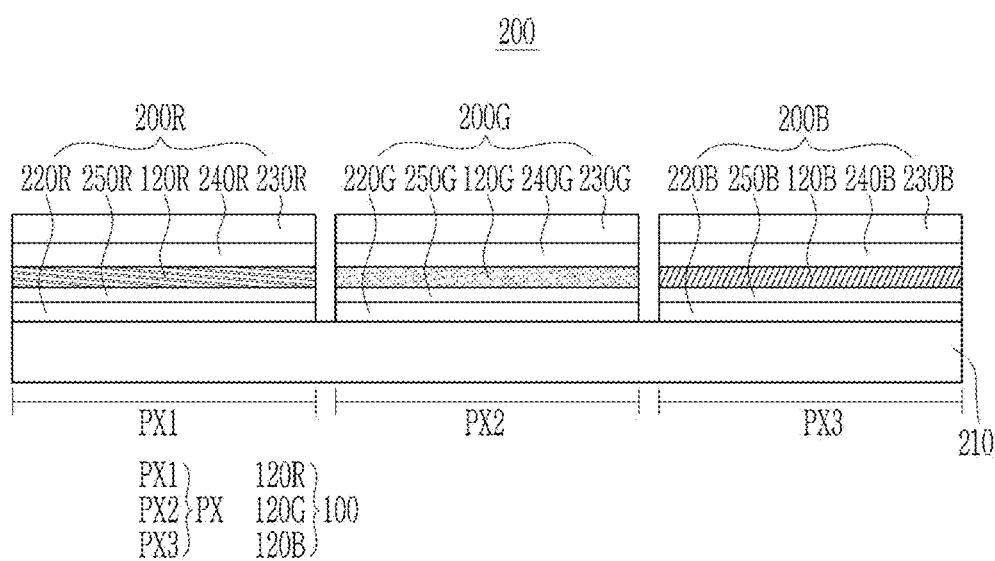
FIG. 7 is a cross-sectional view showing an example of a micro-light-emitting diode according to an embodiment.

FIG. 7 is a cross-sectional view showing an example of a micro-light-emitting diode according to an embodiment.

The micro-light-emitting diode 200 according to an embodiment includes a plurality of subpixels PX1, PX2, and PX3, and the plurality of subpixels PX1, PX2, and PX3 may have a matrix arrangement which is repeatedly arranged along columns and/or rows. The plurality of subpixels PX1, PX2, and PX3 configured to display different colors from each other may form one pixel PX. For example, a subpixel PX1 configured to display red, a subpixel PX2 configured to display green, and a subpixel PX3 configured to display blue may form one pixel.

The subpixels PX1, PX2, and PX3 may have an island shape having a dimension of several to several tens of micrometers, and may have a planar shape of a polygonal shape such as a square, rectangular, hexagonal, or octagonal shape, a circular shape, or an elliptical shape, but are not limited thereto. Herein, the dimension may be a width and/or a length, and when the planar shape of the subpixels PX1, PX2, and PX3 is a circular or elliptical shape, the width may be a diameter or a longest diameter.

The width and length (or diameter) of the subpixels PX1, PX2, and PX3 may be substantially the same as the dimension of the aforementioned microstructures 120. For example, it may be less than about 100 μm, within the above range, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 15 μm, less than or equal to about 10 μm, or less than or equal to about 7 μm, and within the above range, greater than about 1 μm and less than or equal to about 80 μm, greater than about 1 μm and less than or equal to about 70 μm, greater than about 1 μm and less than or equal to about 60 μm, greater than about 1 μm and less than or equal to about 50 μm, greater than about 1 μm and less than or equal to about 40 μm, greater than about 1 μm and less than or equal to about 30 μm, greater than about 1 μm and less than or equal to about 20 μm, greater than about 1 μm and less than or equal to about 15 μm, greater than about 1 μm and less than or equal to about 10 μm, or greater than about 1 μm and less than or equal to about 7 μm.

Referring to FIG. 7, a micro-light-emitting diode 200 according to an embodiment includes: a substrate 210; first electrodes 220R, 220G, and 220B on the substrate 210; lower charge auxiliary layers 250R, 250G, and 250B on the first electrodes 220R, 220G, and 220B; a microstructure array 100 including microstructures 120R, 120G, and 120B on the lower charge auxiliary layers 250R, 250G, and 250B; upper charge auxiliary layers 240R, 240G, and 240B on the microstructures 120R, 120G, and 120B; and second electrodes 230R, 230G, and 230B.

The substrate 210 may be made of, for example, inorganic materials such as glass; organic materials such as polycarbonate, polymethyl methacrylate, polyethylene terephthalate, polyethylene naphthalate, polyamide, polyether sulfone, or combinations thereof; or a silicon wafer.

The first electrodes 220R, 220G, and 220B and the second electrodes 230R, 230G, and 230B may face each other, and one of the first electrodes 220R, 220G, and 220B and the second electrodes 230R, 230G, and 230B is an anode and the other is a cathode. For example, the first electrodes 220R, 220G, and 220B may be anodes, and the second electrodes 230R, 230G, and 230B may be cathodes. For example, the first electrodes 220R, 220G, and 220B may be cathodes and the second electrode 230 may be anodes. The first electrodes 220R, 220G, and 220B may be, for example, pixel electrodes, and the second electrodes 230R, 230G, and 230B may be common electrodes. Although the drawings show that the second electrodes 230R, 230G, and 230B are separated for each subpixel, the present disclosure is not limited thereto and may be formed as a single continuous layer.

At least one of the first electrodes 220R, 220G, and 220B and the second electrodes 230R, 230G, and 230B may be a light-transmitting electrode, and the light-transmitting electrode may be made of, for example, a conductive metal oxide such as zinc oxide, indium oxide, tin oxide, indium tin oxide (ITO), indium zinc oxide (IZO), or fluorine-doped tin oxide or a metal thin layer of a single layer or a multilayer. When one of the first electrodes 220R, 220G, and 220B and the second electrodes 230R, 230G, and 230B is a non-light-transmitting electrode, it may be made of an opaque conductor material such as aluminum (Al), silver (Ag), or gold (Au).

The microstructures 120R, 120G, and 120B are disposed between the first electrodes 220R, 220G, and 220B and the second electrodes 230R, 230G, and 230B. As described above, the microstructures 120R, 120G, and 120B include the red light-emitting microstructures 120R, the green light-emitting microstructures 120G, and the blue light-emitting microstructures 120B, respectively. The red light-emitting microstructures 120R include red light-emitting perovskite nanocrystals, a hydrophilic polymer, and optionally a ligand, the green light-emitting microstructures 120G include green light-emitting perovskite nanocrystals, a hydrophilic polymer, and optionally a ligand, and the blue light-emitting microstructures 120B include blue light-emitting perovskite nanocrystals, a hydrophilic polymer, and optionally a ligand. A detailed description is the same as described above.

For example, the first subpixel PX1 may include red light-emitting microstructures 120R, the second subpixel PX2 may include green light-emitting microstructures 120G, and the third subpixel PX3 may include blue light-emitting microstructures 120B. For example, the first subpixel PX1 may be configured to display red, the second subpixel PX2 may be configured to display green, and the third subpixel PX3 may be configured to display blue.

One of the lower charge auxiliary layers 240R, 240G, and 240B and the upper charge auxiliary layers 250R, 250G, and 250B may be a hole auxiliary layer and the other may be an electron auxiliary layer. The hole auxiliary layer may include, for example, a hole injection layer, a hole transport layer, and/or an electron blocking layer, and the electron auxiliary layer may include, for example, an electron injection layer, an electron transport layer, and/or a hole blocking layer. The lower charge auxiliary layers 240R, 240G, and 240B and the upper charge auxiliary layers 250R, 250G, and 250B may include an organic material, an inorganic material, and/or an organic/inorganic material. Either or both of the lower charge auxiliary layers 240R, 240G, and 240B and the upper charge auxiliary layers 250R, 250G, and 250B may be omitted.

The micro-light-emitting diode 200 may be a bottom emission type light emitting diode configured to emit light toward the substrate 210, a top emission type light emitting diode configured to emit light toward the opposite side of the substrate 210, or a dual emission type light emitting diode configured to emit toward both the side of the substrate 210 and the opposite side of the substrate 110, depending on the first electrodes 220R, 220G, and 220B and the second electrodes 230R, 230G, and 230B.

For example, when the first electrodes 220R, 220G, and 220B are light-transmitting electrodes and the second electrodes 230R, 230G, and 230B are non-light-transmitting electrodes, the micro-light-emitting diode 200 may be a bottom emission type light emitting diode.

For example, when the first electrodes 220R, 220G, and 220B are non-light-transmitting electrodes and the second electrodes 230R, 230G, and 230B are light-transmitting electrodes, the micro-light-emitting diode 200 may be a top emission type light emitting diode.

For example, when the first electrodes 220R, 220G, and 220B and the second electrodes 230R, 230G, and 230B are light-transmitting electrodes, the micro-light-emitting diode 200 may be a dual emission type light emitting diode.

The aforementioned micro-light-emitting diode may be applied to various electronic devices requiring light emission, for example, a display device or a lighting device, but is not limited thereto.

Hereinafter, the embodiments are illustrated in more detail with reference to examples. However, these are only examples, and the scope of claims is not limited thereto.

Provision Example 1: Manufacture of Mold

An epoxy-base photoresist (SU-8, Microchem Corp.) is spin-coated on a Si substrate to form a film. Subsequently, the film is sequentially treated with photolithography and etched to form a plurality of cylindrical convex micropatterns of about 10 μm (diameter)×about 10 μm (thickness). Then, on the convex micropattern, an elastomer prepared by mixing a polydimethylsiloxane (PDMS) base and a hardener in a weight ratio of 10:1 (Sylgard 184, Dow Corning) is poured thereinto and then cured at 80° C. for 3 hours. The cured polydimethylsiloxane (PDMS) is separated from the patterned Si substrate to obtain a polydimethylsiloxane (PDMS) mold having a plurality of 10 μm (diameter)×10 μm (depth) cylindrical concave micropatterns.

Preparation of Perovskite Precursor Solutions

Preparation Example 1: Preparation of Red Light-Emitting Perovskite Precursor Solution 0.1 M diphenylphosphoryl azide (DPPA) is added to 10 ml of ethanol and then stirred under a nitrogen atmosphere in an ice bath for 1 hour. Subsequently, HBr in the same molar ratio as DPPA is added thereto and then stirred for 1 hour. Then, precipitates are obtained therefrom, dried under vacuum at 60° C. to remove the solvent, and washed three times with ethyl ether, obtaining powder-type DPPA-Br.

0.2 mM of CsI, 0.18 mM of CsBr, and 0.3 mM of $PbI_2$ are dissolved in 1 mL of dimethylsulfoxide (DMSO), and 10 mg of polyethylene oxide (an average molecular weight of about 600,000) and 10 mg of DPPA-Br are added thereto, preparing a $CsPbBrI_2$ perovskite precursor solution (a red light-emitting perovskite precursor solution).

Comparative Preparation Example 1

A $CsPbBrI_2$ perovskite precursor solution (a red light-emitting perovskite precursor solution) is prepared in the same manner as Preparation Example 1, except that polyethylene oxide and DPPA-Br are not included.

Preparation Example 2: Preparation of Green Light-Emitting Perovskite Precursor Solution 0.1 M diphenylphosphoryl azide (DPPA) is added to 10 ml of ethanol and then stirred under a nitrogen atmosphere in an ice bath for 1 hour. Subsequently, HBr is added in the same molar ratio as DPPA thereto and then stirred for 1 hour. Then, precipitates are obtained therefrom, dried under vacuum at 60° C. to remove the solvent, and washed three times with ethyl ether, obtaining powder-type DPPA-Br.

0.3 mM of CsBr and 0.2 mM of $PbBr_2$ are dissolved in 1 mL of dimethylsulfoxide (DMSO), and 10 mg of polyethylene oxide and 10 mg of DPPA-Br are added thereto, preparing a $CsPbBr_3$ perovskite precursor solution (a green light-emitting perovskite precursor solution).

Preparation Example 3: Preparation of Blue Light-Emitting Perovskite Precursor Solution 0.1 M diphenylphosphoryl azide (DPPA) is added to 10 ml of ethanol and then stirred under a nitrogen atmosphere in an ice bath for 1 hour. Subsequently, HCl is added thereto in the same molar ratio as DPPA and then stirred for 1 hour. Then, precipitates are obtained therefrom, dried under vacuum at 60° C. to remove the solvent, and washed three times with ethyl ether, obtaining powder-type DPPA-Cl.

0.2 mM of CsCl and 0.2 mM of $PbBr_2$ are dissolved in 1 mL of dimethylsulfoxide (DMSO), and 10 mg of polyethyleneoxide and 10 mg of DPPA-Cl are added thereto, preparing a $CsPbBr_2Cl$ perovskite precursor solution (a blue light-emitting perovskite precursor solution).

Evaluation I

Contact angles of the perovskite precursor solutions according to Preparation Examples and Comparative Preparation Examples are evaluated.

The contact angles are measured by a Phoenix 300 contact angle analyzer (Surface Electro Optics (SEO) Co., Ltd.) after dropping 80 μl of each precursor solution according to Preparation Examples and Comparative Preparation Examples on a glass substrate coated with ITO and PEDOT: PSS.

The results are shown in Table 1.

TABLE 1

|  | Contact angle (degrees) |
|---|---|
| Preparation Example 1 | 59 |
| Comparative Preparation Example 1 | 68 |

Referring to Table 1, the perovskite precursor solution according to Preparation Example 1 exhibits low contact angles compared with the perovskite precursor solution according to Comparative Preparation Example 1. Accordingly, the perovskite precursor solution according to Preparation Example 1 is expected to show high wettability with respect to a substrate compared with the perovskite precursor solution according to Comparative Preparation Example 1.

Example I: Formation of Microstructures

Example 1

The red light-emitting perovskite precursor solution according to Preparation Example 1 is spin-coated on an ITO-deposited glass substrate at 1000 rpm, 2000 rpm, 3000 rpm, 4000 rpm, and 5000 rpm for 30 seconds to form a red light-emitting perovskite precursor film with a flat surface in a gel state. Subsequently, a polydimethylsiloxane (PDMS) mold according to Provision Example 1 is placed on the red light-emitting perovskite precursor film and then heat-treated at 90° C. for 20 minutes, while being pressed. Then, the PDMS mold is removed from the substrate to obtain red light-emitting microstructures.

Example 2

Green light-emitting microstructures are manufactured in the same manner as Example 1, except that the green light-emitting perovskite precursor solution according to Preparation Example 2 is used instead of the red light-emitting perovskite precursor solution according to Preparation Example 1.

Example 3

Blue light-emitting microstructures are manufactured in the same manner as Example 1, except that the blue light-emitting perovskite precursor solution according to Preparation Example 3 is used instead of the red light-emitting perovskite precursor solution according to Preparation Example 1.

Comparative Example 1

Red light-emitting microstructures are manufactured in the same manner as Example 1, except that the red light-emitting perovskite precursor solution according to Comparative Preparation Example 1 is used instead of the red light-emitting perovskite precursor solution according to Preparation Example 1.

Evaluation I

The microstructures according to Examples are evaluated with respect to shapes according to a spin-coating rate.

The microstructures are evaluated by using an optical microscope (Olympus Corp.) and a scanning electron microscope (S-5000, Hitachi, Ltd.).

The results are shown in FIGS. 8 to 11.

Figure 8:
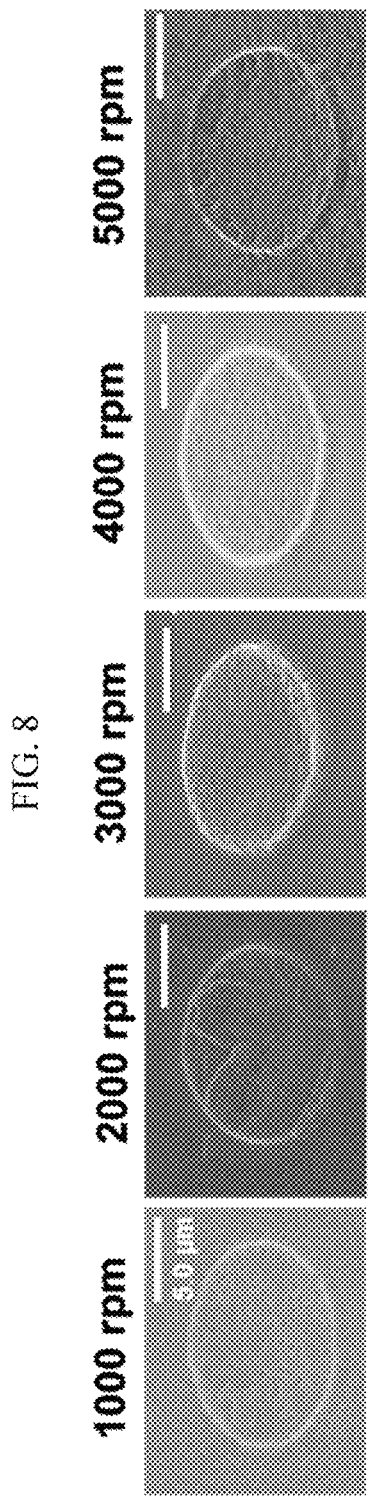
FIG. 8 is SEM images of the microstructure according to the spin-coating rate of the red light-emitting perovskite precursor solution in the microstructure according to Example 1.
Figure 9:
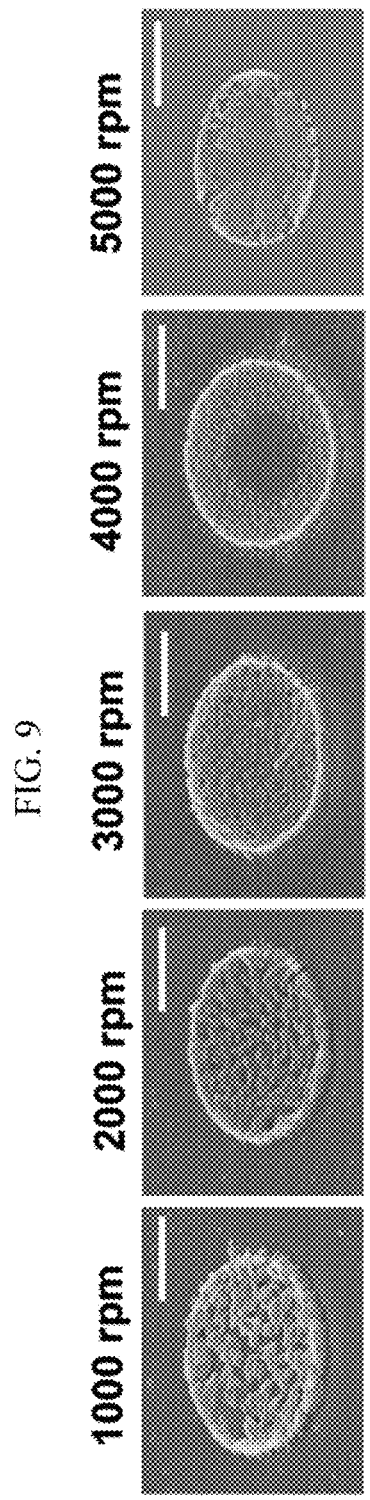
FIG. 9 is SEM images of the microstructure according to the spin-coating rate of the green light-emitting perovskite precursor solution in the microstructure according to Example 2.
Figure 10:
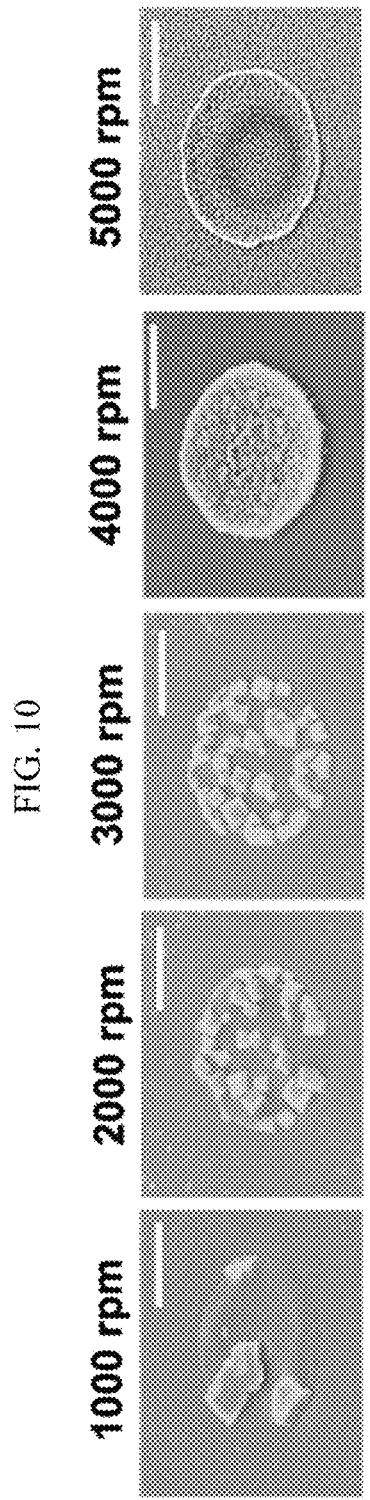
FIG. 10 is SEM images of the microstructure according to the spin-coating rate of the blue light-emitting perovskite precursor solution in the microstructure according to Example 3.
Figure 11:
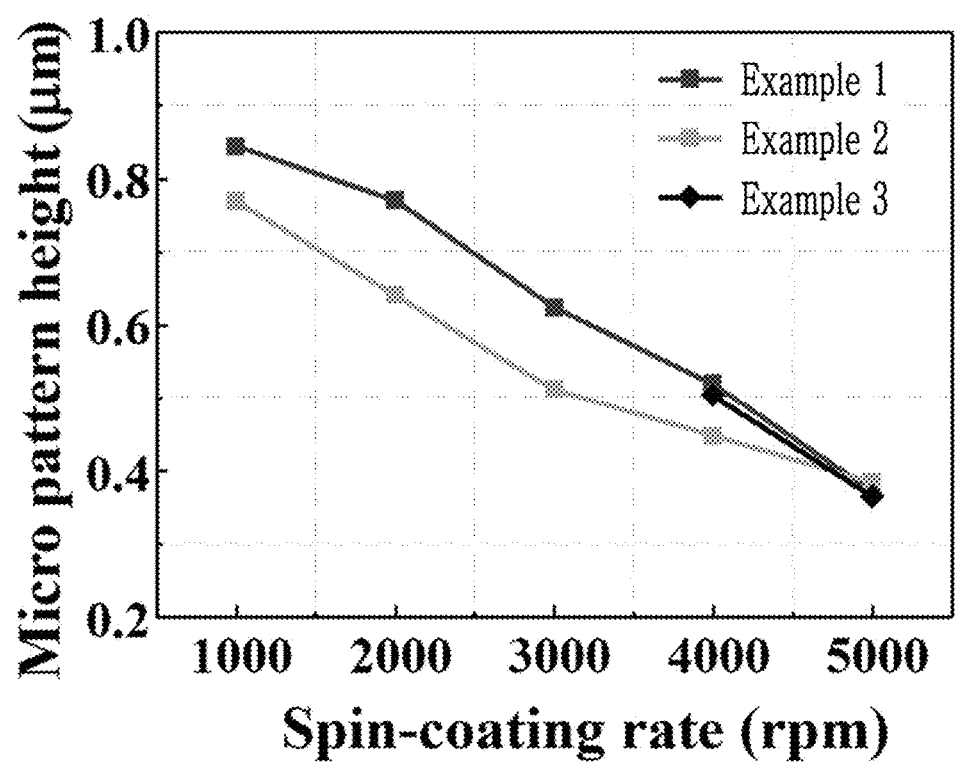
FIG. 11 is a graph showing the thicknesses of the microstructures according to the spin-coating rates of the perovskite precursor solutions in the microstructures according to Examples 1 to 3.

FIG. 8 is SEM images of the microstructure according to the spin-coating rate of the red light-emitting perovskite precursor solution in the microstructure according to Example 1, FIG. 9 is SEM images of the microstructure according to the spin-coating rate of the green light-emitting perovskite precursor solution in the microstructure according to Example 2, FIG. 10 is SEM images of the microstructure according to the spin-coating rate of the blue light-emitting perovskite precursor solution in the microstructure according to Example 3, and FIG. 11 is a graph showing the thicknesses of the microstructures according to the spin-coating rates of the perovskite precursor solutions in the microstructures according to Examples 1 to 3.

Referring to FIGS. 8 to 10, the microstructures have different shapes and uniformity according to spin-coating rates of the perovskite precursor solutions, from which there is each optimal spin-coating rate.

Referring to FIG. 11, the microstructures have a different thickness according to a spin-coating rate for each perovskite precursor solution. Particularly, each spin-coating rate may be determined so that the red light-emitting microstructures according to Example 1, the green light-emitting microstructures according to Example 2, and the blue light-emitting microstructures according to Example 3 may have a small thickness (average thickness) difference, for example, when the red light-emitting microstructures according to Example 1 are spin-coated at 4000 rpm, the green light-emitting microstructures according to Example 2 are spin-coated at 3000 rpm, and when the red light-emitting microstructures according to Example 3 are spin-coated at 4000 rpm, the red light-emitting microstructures, the green light-emitting microstructures, and the blue light-emitting microstructures have each thickness of about 0.5 μm, which is a smallest thickness difference among the red light-emitting microstructures, the green light-emitting microstructures, and the blue light-emitting microstructures.

Evaluation II

The microstructures according to Example 1 and Comparative Example 1 manufactured at the same spin-coating rate are evaluated with respect to shapes.

Figure 12A:
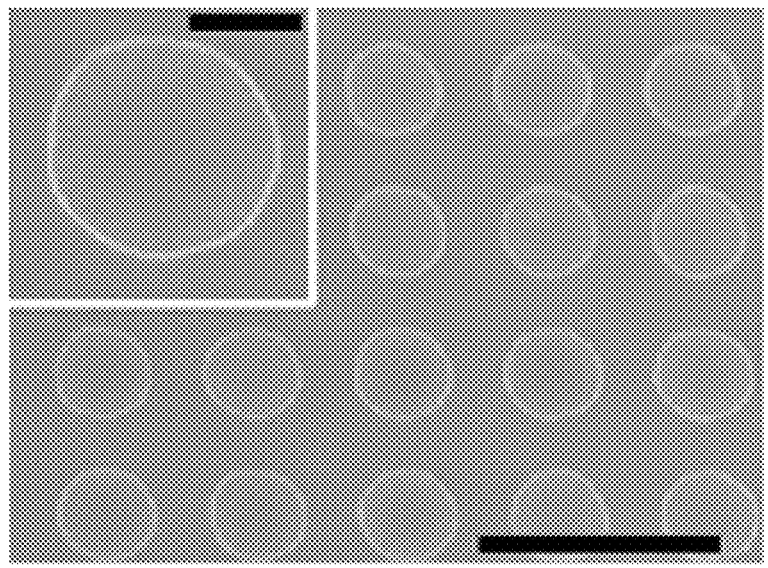
FIG. 12A is a SEM image of the microstructure (spin-coating rate: 4000 rpm) according to Example 1.
Figure 12B:
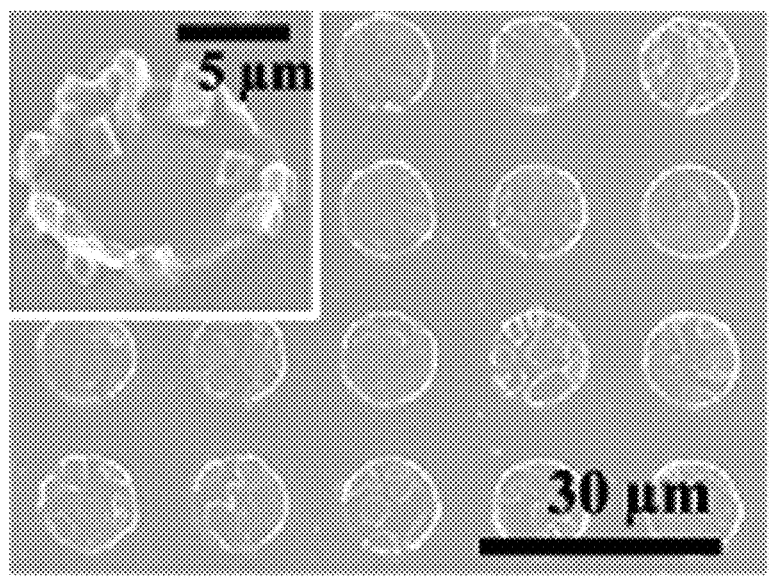
FIG. 12B is a SEM image of the microstructure (spin-coating rate: 4000 rpm) according to Comparative Example 1.

FIG. 12A is SEM images of the microstructure (spin-coating rate: 4000 rpm) according to Example 1, and FIG. 12B is SEM images of the microstructure (spin-coating rate: 4000 rpm) according to Comparative Example 1.

Referring to FIGS. 12A and 12B, the microstructures according to Example 1 are formed to have a uniform shape, size, and thickness, compared with the microstructures according to Comparative Example 1.

Evaluation III

The microstructures according to Examples are evaluated with respect to an average size of nanocrystals according to a spin-coating rate.

The average sizes of the nanocrystals of the microstructures are evaluated by using a transmission electron microscope (S-5000, Hitachi Ltd.).

The results are shown in Table 2.

TABLE 2

| | Nanocrystal average size according to spin-coating rate (nm) | | | |
|---|---|---|---|---|
| | 1000 rpm | 2000 rpm | 3000 rpm | 4000 rpm |
| Example 1 | 1242 | 540 | 143 | 74 |
| Example 2 | 1633 | 629 | 97 | 93 |
| Example 3 | 3341 | 1143 | 882 | 82 |

Referring to Table 2, the microstructures according to Examples have a different nanocrystal size according to a spin-coating rate, and when spin-coated at about 3000 rpm to 4000 rpm, relatively small crystals are formed.

Evaluation IV

The microstructures according to Examples are evaluated with respect to a distribution of constituent elements.

The nanocrystals of the microstructures are evaluated by using SEM-EDS mapping.

Figure 13:
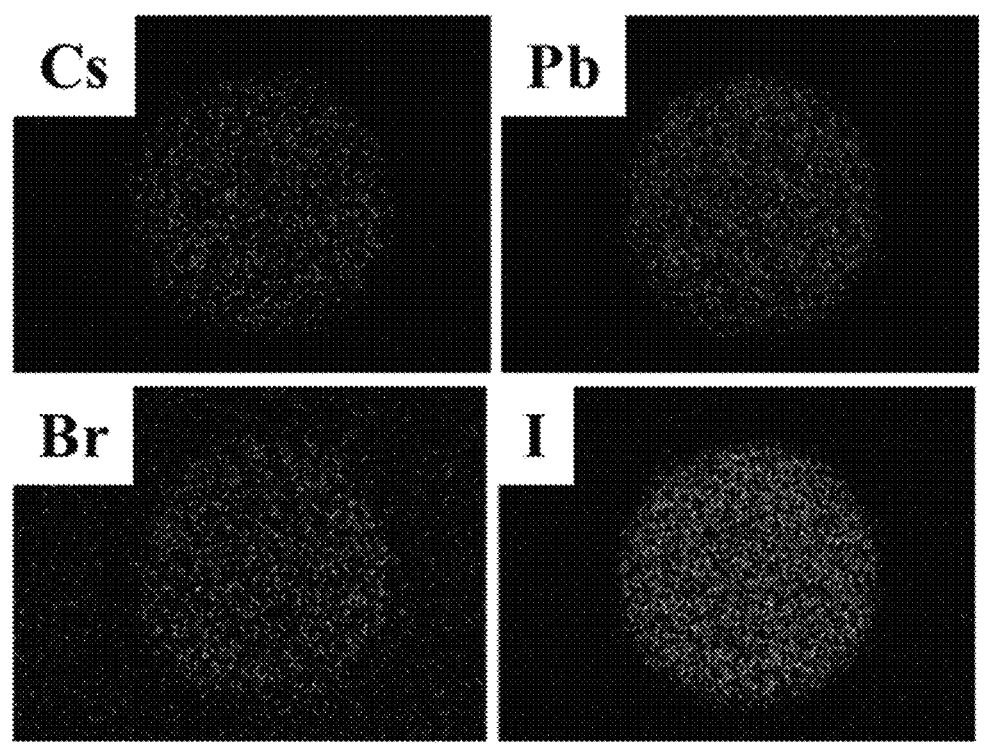
FIG. 13 is a SEM-EDS mapping result of the red light-emitting microstructures according to Example 1.
Figure 14:
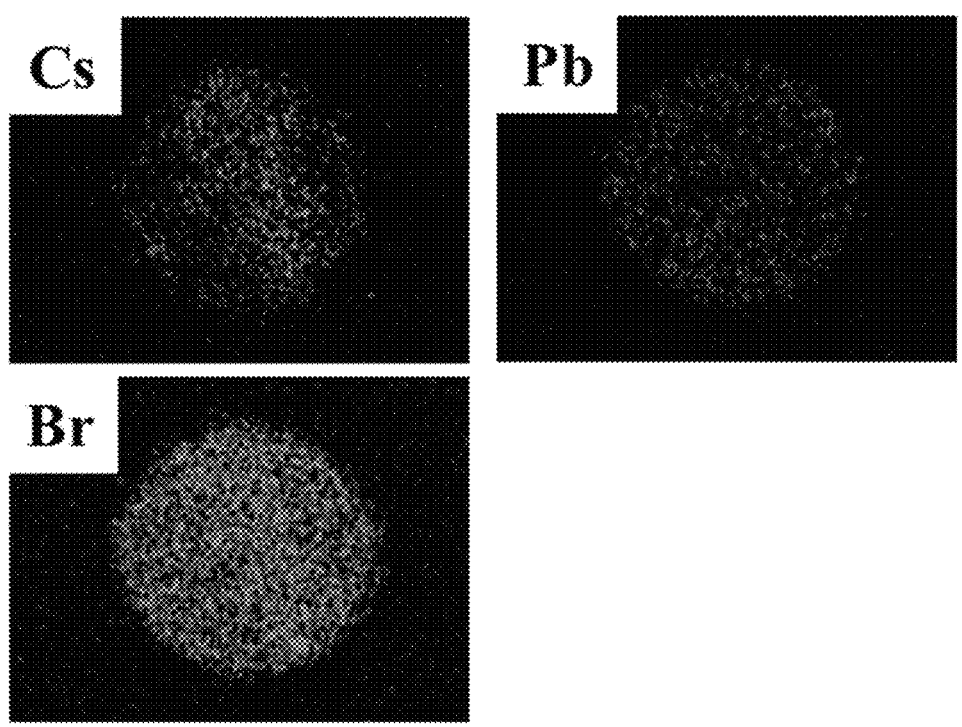
FIG. 14 is a SEM-EDS mapping result of the green light-emitting microstructures according to Example 2.
Figure 15:
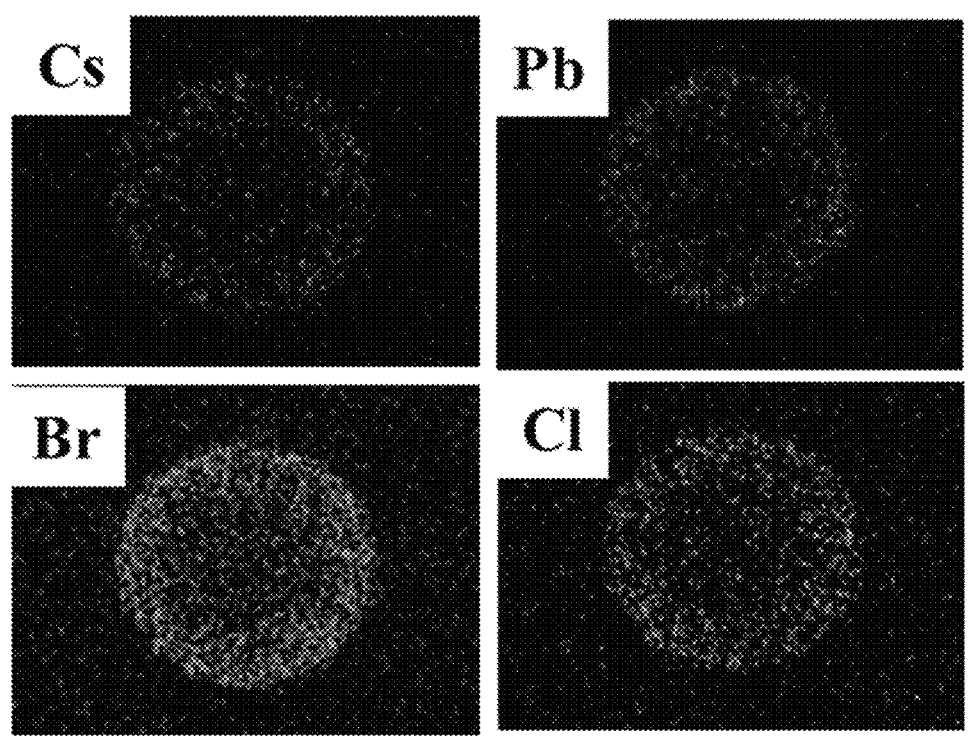
FIG. 15 is an SEM-EDS mapping result of the blue light-emitting microstructures according to Example 3.

FIG. 13 is a SEM-EDS mapping result of the red light-emitting microstructures according to Example 1, FIG. 14 is a SEM-EDS mapping result of the green light-emitting microstructures according to Example 2, and FIG. 15 is a SEM-EDS mapping result of the blue light-emitting microstructures according to Example 3.

Referring to FIGS. 13 to 15, the red, green, and blue light-emitting microstructures according to Examples 1, 2, and 3 exhibit that the constituent elements are uniformly distributed within a size (diameter) of about 10 μm.

Accordingly, the red, green, and blue light-emitting microstructures according to Examples 1, 2, and 3 exhibit that each constituent element is uniformly distributed in subpixels.

Evaluation V

The microstructures according to Examples are evaluated with respect to photoluminescence characteristics.

The photoluminescence of the microstructures according to Examples are examined by irradiating a He—Cd laser ($\lambda$=325 nm) thereto and using a micro-photoluminescence system (Dongwoo Optron Co., Ltd.).

Figure 16:
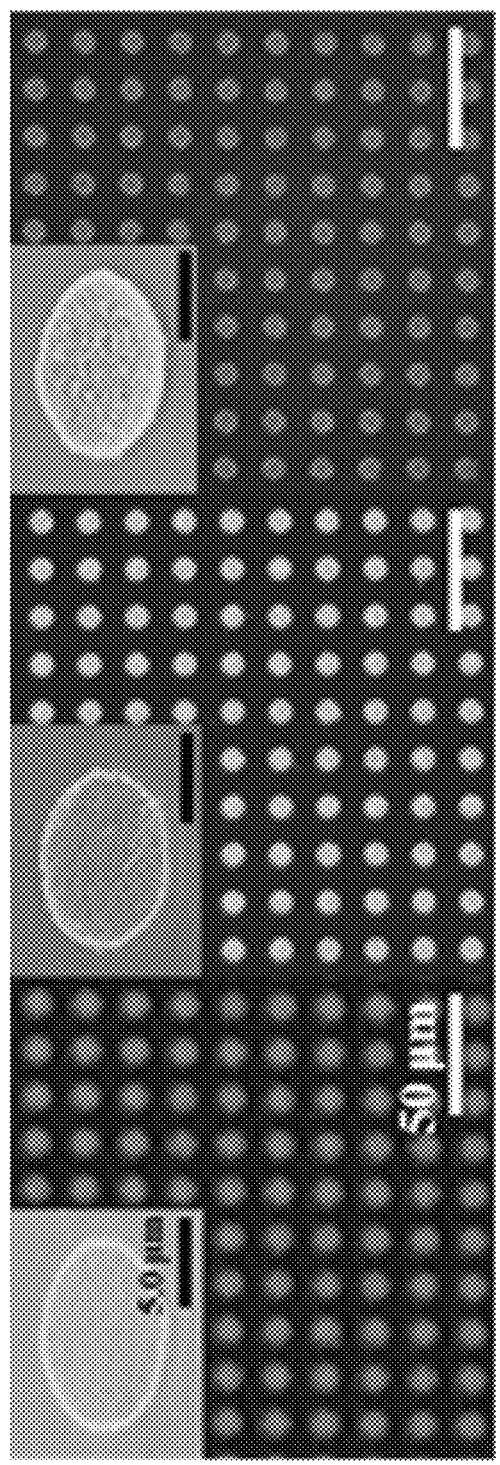
FIG. 16 is a photoluminescence photograph of microstructures according to Examples 1, 2, and 3.

The results are shown in FIG. 16 and Table 3.

FIG. 16 is a photoluminescence photograph of the microstructures according to Examples 1, 2, and 3.

TABLE 3

| | Emission spectrum (PL) | |
| --- | --- | --- |
| | Maximum emission wavelength (nm) | Full width at half maximum (FWHM) (nm) |
| Example 1 | 647.4 | 31.2 |
| Example 2 | 520.7 | 22.3 |
| Example 3 | 477.2 | 21.1 |

Referring to FIG. 16 and Table 3, the microstructures according to Examples have a relatively narrow full width at half maximum (FWHM) and exhibit satisfactory red, green, and blue emission spectra.

Example II: Formation of Micro-Light-Emitting Diodes

Example 4

An ITO-deposited glass substrate (10 Ω/cm², ITO substrate) is washed with acetone, deionized water, and isopropyl alcohol respectively for 10 minutes and dried with nitrogen ($N_2$). Subsequently, the washed ITO substrate is oxygen plasma-treated at 80 W for 5 minutes. Then, PEDOT:PSS is spin-coated (3000 rpm, 40 seconds) on the ITO substrate and annealed at 140° C. for 20 minutes to form a 40 nm-thick hole transport layer. Subsequently, a PDMS partition wall (0.2 cm²×2 cm²) is disposed on the hole transport layer (HTL) and divided into three regions (first, second, and third regions), and then the red light-emitting perovskite precursor solution according to Preparation Example 1 is spin-coated (4000 rpm, 30 seconds) in the first region to form a red light-emitting perovskite precursor film, the green light-emitting perovskite precursor solution according to Preparation Example 2 is spin-coated (3000 rpm, 30 seconds) in the second region to form a green light-emitting perovskite precursor film, and the blue light-emitting perovskite precursor solution according to Preparation Example 3 is spin-coated (4000 rpm, 30 seconds) in the third region to form a blue light-emitting perovskite precursor film. Subsequently, the polydimethylsiloxane (PDMS) mold according to Provision Example 1 is respectively placed on the red light-emitting perovskite precursor film, the green light-emitting perovskite precursor film, and the blue light-emitting perovskite precursor film, and then heat-treated at 90° C. for 20 minutes, while being pressed. Then, the PDMS molds are removed from the substrate to obtain the red light-emitting microstructures, the green light-emitting microstructures, and the blue light-emitting microstructures. Subsequently, PMMA (in toluene, 5 mg/mL, average molecular weight (Mw) of about 120,000) is respectively spin-coated (5000 rpm, 30 seconds) on the red light-emitting microstructures, the green light-emitting microstructures, and the blue light-emitting microstructures to form a 10 nm-thick electron auxiliary layer. Then, LiF and Al are sequentially deposited on the electron auxiliary layer by using an e-beam evaporator to form a 1 nm-thick LiF and 100 nm-thick Al electrodes to form red, green, and blue microstructure arrays.

Evaluation VI

The micro-light-emitting diode according to Example 4 is evaluated with respect to electroluminescence characteristics.

The electroluminescence characteristics are evaluated by applying voltages of 4.5 V (red), 6.5 V (green), and 7.5 V (blue) to the micro-light-emitting diodes according to Example 4 by using a SourceMeter (Keithley 2400, Keithley Co.).

Figure 17:
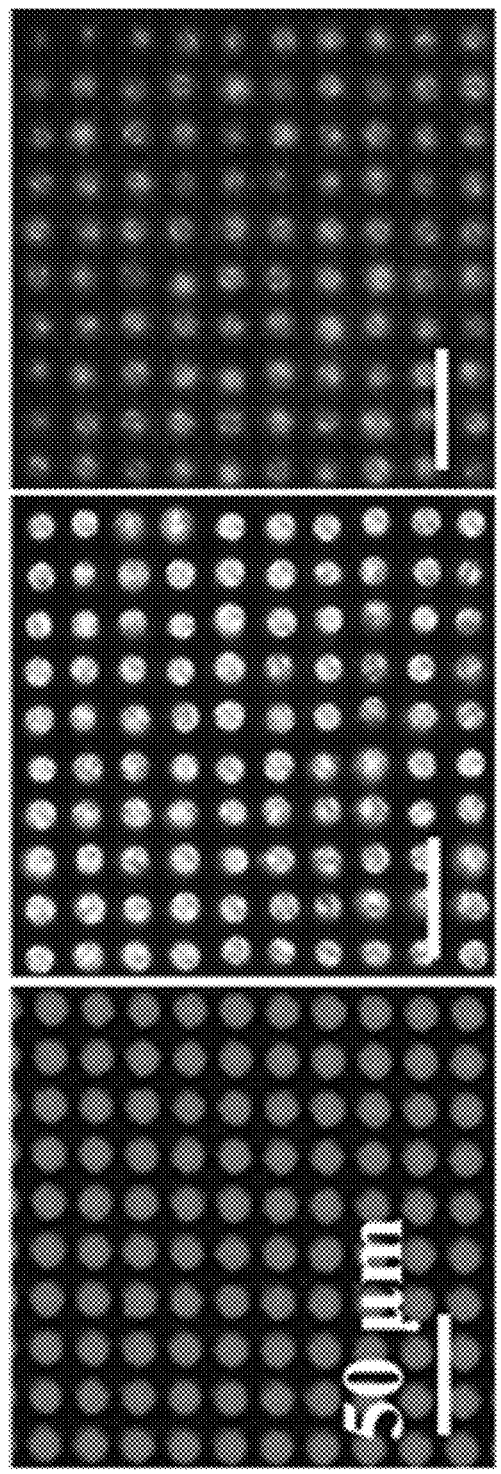
FIG. 17 is an electroluminescence photograph of the micro-light-emitting diode according to Example 4.

The results are shown in FIG. 17 and Table 4.

FIG. 17 is an emission photograph of the micro-light-emitting diode according to Example 4.

TABLE 4

| | Emission spectrum (EL) (R/G/B) | |
| --- | --- | --- |
| | Maximum emission wavelength (nm) | Full width at half maximum (FWHM)(nm) |
| Example 4 | 650 nm/521 nm/484 nm | 31 nm/22 nm/21 nm |

Referring to FIG. 17 and Table 4, the micro-light-emitting diode according to Example 4 exhibits a relatively narrow full width at half maximum (FWHM) and thus has satisfactory light emission characteristics.

Evaluation VII

The micro-light-emitting diode according to Example 4 is evaluated with respect to electrical characteristics.

The electroluminescence characteristics are evaluated by applying a voltage to the micro-light-emitting diodes according to Examples with a SourceMeter (Keithley 2400, Keithley Co.), and external quantum efficiency (EQE) is evaluated by using a light efficiency-measuring system (integrating sphere and a spectroradiometer, Optoelectronic Precision Co.).

The results are shown in Table 5.

TABLE 5

| | EQE (R/G/B) (%) |
| --- | --- |
| Example 4 | 1.1/2.5/0.4 |

Referring to Table 5, the micro-light-emitting diode according to Example 4 exhibits satisfactory electrical characteristics.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of manufacturing a microstructure array, the method comprising
preparing a red light-emitting perovskite precursor solution, a green light-emitting perovskite precursor solution, and a blue light-emitting perovskite precursor solution, respectively,
coating the red light-emitting perovskite precursor solution, the green light-emitting perovskite precursor solution, and the blue light-emitting perovskite precursor solution, respectively, on a substrate having partitioned first, second, and third regions to form a red light-emitting perovskite precursor film, a green light-emitting perovskite precursor film, and a blue light-emitting perovskite precursor film, disposing a mold having a plurality of concave micropatterns on the red light-emitting perovskite precursor film, the green light-emitting perovskite precursor film, and the blue light-emitting perovskite precursor film, respectively, heat-treating the red light-emitting perovskite precursor film, the green light-emitting perovskite precursor film, and the blue light-emitting perovskite precursor film in the plurality of concave micropatterns to obtain each of red light-emitting perovskite nanocrystals, green light-emitting perovskite nanocrystals, and blue light-emitting perovskite nanocrystals, and removing the mold to form a microstructure array in which a plurality of red light-emitting microstructures comprising the red light-emitting perovskite nanocrystals, a plurality of green light-emitting microstructures comprising the green light-emitting perovskite nanocrystals, and a plurality of blue light-emitting microstructures comprising the blue light-emitting perovskite nanocrystals are arranged.

2. The method of claim 1, wherein the forming of the red light-emitting perovskite precursor film, the green light-emitting perovskite precursor film, and the blue light-emitting perovskite precursor film comprises spin-coating the red light-emitting perovskite precursor solution, the green light-emitting perovskite precursor solution, and the blue light-emitting perovskite precursor solution.

3. The method of claim 2, wherein the spin-coating of the red light-emitting perovskite precursor solution, the green light-emitting perovskite precursor solution, and the blue light-emitting perovskite precursor solution is performed at a spin-coating rate at which a difference between an average thickness of the red light-emitting microstructures, the green light-emitting microstructures, and the blue light-emitting microstructure is minimized.

4. The method of claim 3, wherein a difference between average thicknesses of the red light-emitting microstructures, the green light-emitting microstructures, and the blue light-emitting microstructures is less than or equal to about 0.1 μm.

5. The method of claim 3, wherein each average thickness of the red light-emitting microstructures, the green light-emitting microstructures, and the blue light-emitting microstructures is less than or equal to about 1 μm.

6. The method of claim 3, wherein the spin-coating of the red light-emitting perovskite precursor solution, the green light-emitting perovskite precursor solution, and the blue light-emitting perovskite precursor solution is performed at each spin-coating rate of about 3000 rpm to about 4000 rpm.

7. The method of claim 1, wherein each average crystal dimension of the red light-emitting perovskite nanocrystals, the green light-emitting perovskite nanocrystals, and the blue light-emitting perovskite nanocrystals is less than or equal to about 200 nm.

8. The method of claim 1, wherein each of the red light-emitting perovskite precursor solution, the green light-emitting perovskite precursor solution, and the blue light-emitting perovskite precursor solution comprises a perovskite precursor and a hydrophilic polymer.

9. The method of claim 8, wherein the hydrophilic polymer comprises polyethylene oxide, polyvinylpyrrolidone, polyethyleneimine, polyacrylamide, poly(meth)acrylate, polyvinyl alcohol, polyethylene glycol, polyoxazoline, a derivative thereof, or a copolymer thereof.

10. The method of claim 8, wherein each of the red light-emitting perovskite precursor solution, the green light-emitting perovskite precursor solution, and the blue light-emitting perovskite precursor solution further comprise a ligand.

11. The method of claim 10, wherein the ligand is represented by RCOOH, $RNH_2$, $R_2NH$, $R_3N$, $RN_3$, RSH, $RH_2PO$, $R_2HPO$, $R_3PO$, $RH_2P$, $R_2HP$, $R_3P$, $RN_3O_3P$, ROH, RCOOR, $RPO(OH)_2$, RPOOH, RHPOOH, or $R_2POOH$, wherein each R is independently a substituted or unsubstituted C1 to C40 aliphatic hydrocarbon, a substituted or unsubstituted C6 to C40 aromatic hydrocarbon, or a combination thereof.

12. The method of claim 1, wherein the heat-treating is performed at a temperature of about 50° C. to about 200° C.

13. A method of manufacturing a micro-light-emitting diode, comprising
forming a first electrode,
forming a microstructure array on the first electrode, and
forming a second electrode on the microstructure array,
wherein the forming of the microstructure array is performed by the method of claim 1.

* * * * *